(12) United States Patent
Jeon et al.

(10) Patent No.: US 12,268,068 B2
(45) Date of Patent: Apr. 1, 2025

(54) DISPLAY DEVICE AND METHOD FOR MANUFACTURING THE SAME

(71) Applicant: SAMSUNG DISPLAY CO., LTD., Yongin-si (KR)

(72) Inventors: Bo Geon Jeon, Yongin-si (KR); Min Suk Ko, Yongin-si (KR); Jong Jun Baek, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/430,632

(22) Filed: Feb. 1, 2024

(65) Prior Publication Data

US 2024/0237438 A1    Jul. 11, 2024

Related U.S. Application Data

(62) Division of application No. 17/307,906, filed on May 4, 2021, now Pat. No. 11,895,880.

(30) Foreign Application Priority Data

Nov. 30, 2020   (KR) .................. 10-2020-0164920

(51) Int. Cl.
*H10K 59/131*   (2023.01)
*H10K 59/121*   (2023.01)
*H10K 59/12*    (2023.01)

(52) U.S. Cl.
CPC ......... *H10K 59/131* (2023.02); *H10K 59/121* (2023.02); *H10K 59/1201* (2023.02)

(58) Field of Classification Search
CPC .................. H10K 59/121; H10K 59/131
See application file for complete search history.

(56) References Cited

U.S. PATENT DOCUMENTS

| 8,810,477 B2 | 8/2014 | Kim et al. |
| 2015/0144952 A1 | 5/2015 | Kim et al. |
| 2019/0113813 A1 | 4/2019 | Okabe et al. |
| 2021/0082963 A1 | 3/2021 | Long |
| 2022/0037620 A1* | 2/2022 | Baek ............... H10K 59/38 |

FOREIGN PATENT DOCUMENTS

| EP | 2814074 A1 | 12/2014 |
| KR | 10-1157425 B1 | 6/2012 |
| KR | 10-1308295 B1 | 9/2013 |
| WO | WO 2020/024734 A1 | 2/2020 |

* cited by examiner

*Primary Examiner* — Douglas M Menz
(74) *Attorney, Agent, or Firm* — Womble Bond Dickinson (US) LLP

(57) ABSTRACT

A display device includes: a base layer including a first surface, and a second surface; a plurality of pixels on the first surface; and a plurality of first lines on the first surface. The base layer includes: a first base layer; an etch stop layer on the first base layer; a plurality of second lines on the etch stop layer; and a second base layer on the etch stop layer and the second lines. The first base layer, the etch stop layer, the second lines, and the second base layer are sequentially stacked, and the first lines are electrically connected to the second lines through first contact holes.

6 Claims, 23 Drawing Sheets

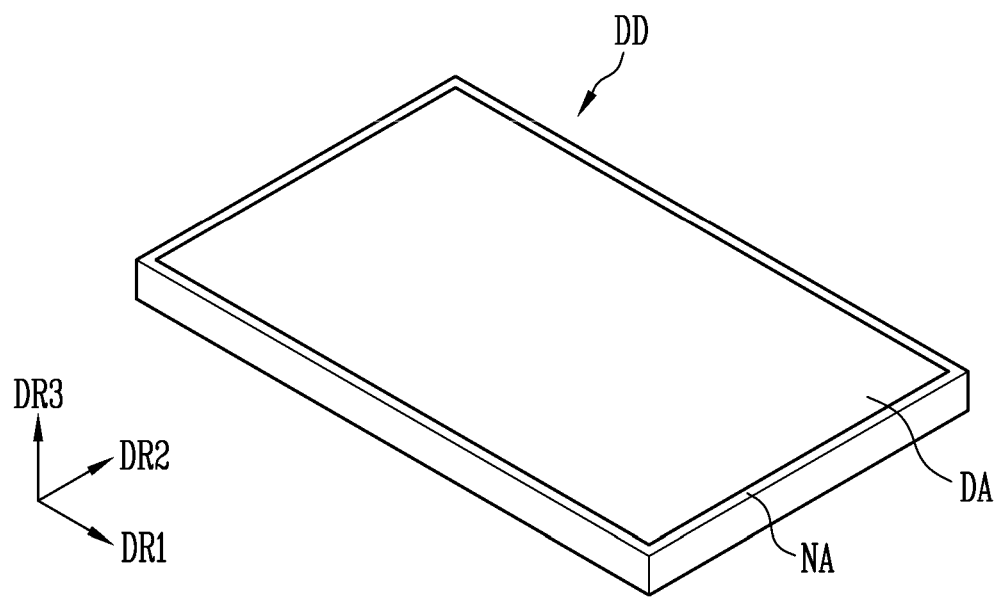

FIG. 2A
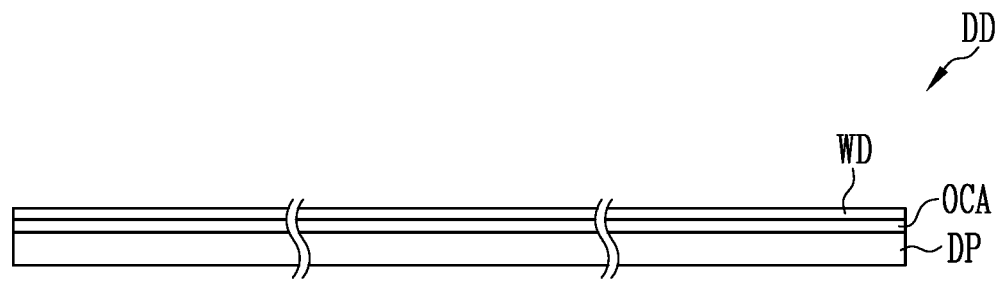
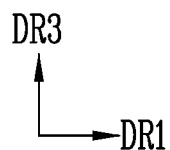

DISPLAY DEVICE AND METHOD FOR MANUFACTURING THE SAME

CROSS-REFERENCE TO RELATED APPLICATIONS

This application is a divisional of U.S. patent application Ser. No. 17/307,906, filed May 4, 2021, which claims priority to and the benefit of Korean Patent Application No. 10-2020-0164920, filed Nov. 30, 2020, the entire content of both of which is incorporated herein by reference.

BACKGROUND

1. Field

Aspects of one or more embodiments of the present disclosure relate to a display device, and a method for manufacturing the display device.

2. Discussion of the Related Art

With the development of information technology, the importance of display devices as a connecting medium between users and information is emerging. In this regard, the uses of display devices, for example, such as a liquid crystal display device and an organic light emitting display device, are increasing.

In order to manufacture a large-screen display device, a tiled display in which a plurality of display devices are connected to each other has been put into practical use, and has been used for outdoor advertisements. The tiled display implements a large screen by fixing a plurality of display panels having a predetermined size to a mounting frame. In this case, a bezel may be positioned at a boundary portion between the display panels, and such a bezel may be visually recognized. Thus, display quality of the tiled display may be deteriorated.

The above information disclosed in this Background section is for enhancement of understanding of the background of the present disclosure, and therefore, it may contain information that does not constitute prior art.

SUMMARY

Recently, in order to reduce a bezel width of a display panel, a method of forming contact holes in an area overlapping with a display area of the display panel, and connecting signal lines of the display panel to a driving circuit unit through the contact holes is being studied. However, when a base layer of the display panel includes (e.g., is formed of) a glass substrate, it may take a long time to form the contact holes, and thus, the yield of the display panel may be decreased due to process difficulties.

One or more embodiments of the present disclosure are directed to a display device in which contact holes may be efficiently formed in a base layer thereof, and a method for manufacturing the display device.

However, the aspects and features of the present disclosure are not limited to those described above, and the present disclosure may include other various aspects and features as would be understood to those having ordinary skill in the art without departing from the spirit and scope of the present disclosure.

According to one or more embodiments of the present disclosure, a display device includes: a base layer including a first surface, and a second surface; a plurality of pixels on the first surface; and a plurality of first lines on the first surface. The base layer includes: a first base layer; an etch stop layer on the first base layer; a plurality of second lines on the etch stop layer; and a second base layer on the etch stop layer and the second lines. The first base layer, the etch stop layer, the second lines, and the second base layer are sequentially stacked, and the first lines are electrically connected to the second lines through first contact holes.

In an embodiment, the display device may further include a plurality of pads on the second surface, and the etch stop layer may include doping areas at an area where the second lines and the pads overlap with each other in a thickness direction.

In an embodiment, the etch stop layer may include a semiconductor material, and the doping areas may include a conductive material.

In an embodiment, the etch stop layer may include amorphous silicon, and the doping areas may be doped with boron.

In an embodiment, the doping areas and the pads may be electrically connected to each other through second contact holes.

In an embodiment, the display device may further include a display area on the first surface, and configured to display an image, the pixels may be at the display area, and the pads on the second surface may overlap with the display area.

In an embodiment, the first lines may include first gate lines and first data lines connected to the pixels.

In an embodiment, the second lines may at least partially overlap with the first lines, and the second lines may include second gate lines electrically connecting the first gate lines to some of the pads, and second data lines electrically connecting the first data lines to others of the pads.

In an embodiment, the pixels may include: circuit elements connected to the first gate lines and the first data lines; and light emitting elements connected to the circuit elements.

In an embodiment, the first base layer and the second base layer may include a flexible plastic material.

In an embodiment, the plastic material may be polyimide.

In an embodiment, a surface of the first base layer may coincide with the second surface, and a surface of the second base layer may coincide with the first surface.

In an embodiment, the display device may further include a first barrier layer between the etch stop layer and the second base layer.

In an embodiment, the display device may further include a second barrier layer on an opposite surface of the second base layer opposite to a surface of the second base layer contacting the first barrier layer, and the first barrier layer and the second barrier layer may include a metal oxide or a metal nitride.

According to one or more embodiments of the present disclosure, a method for manufacturing a display device, includes: forming a first base layer on a carrier substrate; forming an etch stop layer on the first base layer; forming a plurality of second lines on the etch stop layer; forming a second base layer on the etch stop layer and the second lines; forming a plurality of pixels and a plurality of first lines on the second base layer; and forming a plurality of first contact holes for electrically connecting the first lines to the second lines.

In an embodiment, the first contact holes may be formed using dry etching.

In an embodiment, the method may further include forming a plurality of pads on a surface of the first base layer, and the forming of the etch stop layer may include forming doping areas in areas of the etch stop layer overlapping with the second lines and/or the pads in a thickness direction.

In an embodiment, the method may further include forming second contact holes in areas of the first base layer overlapping with the second lines and/or the doping areas in the thickness direction.

In an embodiment, the second contact holes may be formed using a laser process.

In an embodiment, the etch stop layer may include amorphous silicon, and the doping areas may be doped with boron.

BRIEF DESCRIPTION OF THE DRAWINGS

The above and other aspects and features of the present disclosure will be more clearly understood from the following detailed description of the illustrative, non-limiting example embodiments with reference to the accompanying drawings.

FIG. 1 is a perspective view illustrating a display device according to an embodiment of the present disclosure.

FIGS. 2A-2B are cross-sectional views illustrating a display device according to one or more embodiments of the present disclosure.

DETAILED DESCRIPTION

Figure 2B:
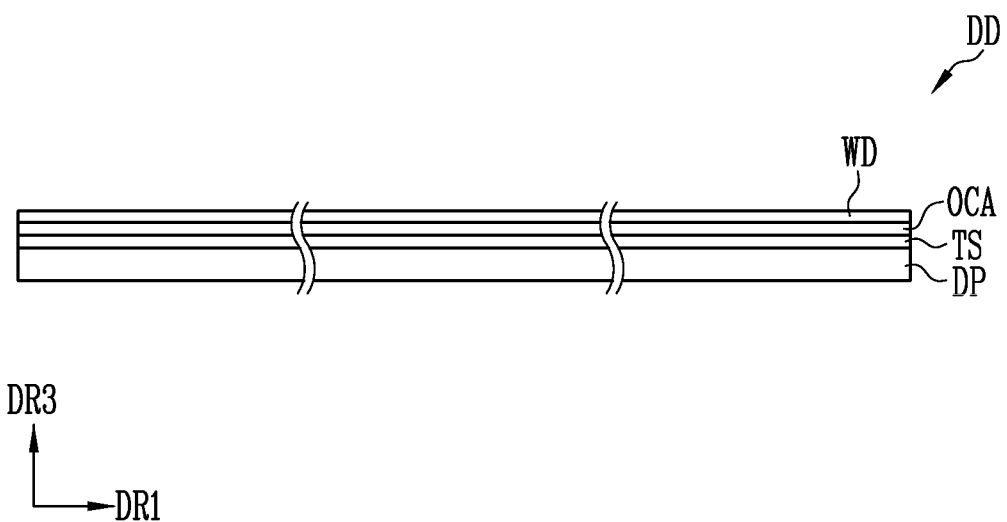

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the first direction, the second direction, and the third direction are not limited to three axes of the rectangular coordinate system, and may be interpreted in a broader sense. For example, the first direction, the second direction, and the third direction may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 3A:
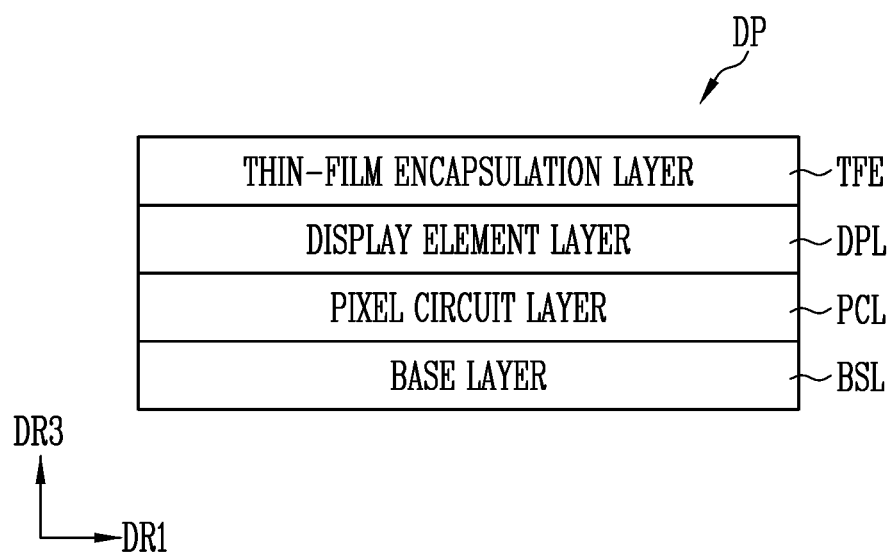
FIG. 3A is a cross-sectional view schematically illustrating a configuration of a display panel according to an embodiment of the present disclosure.
Figure 3B:
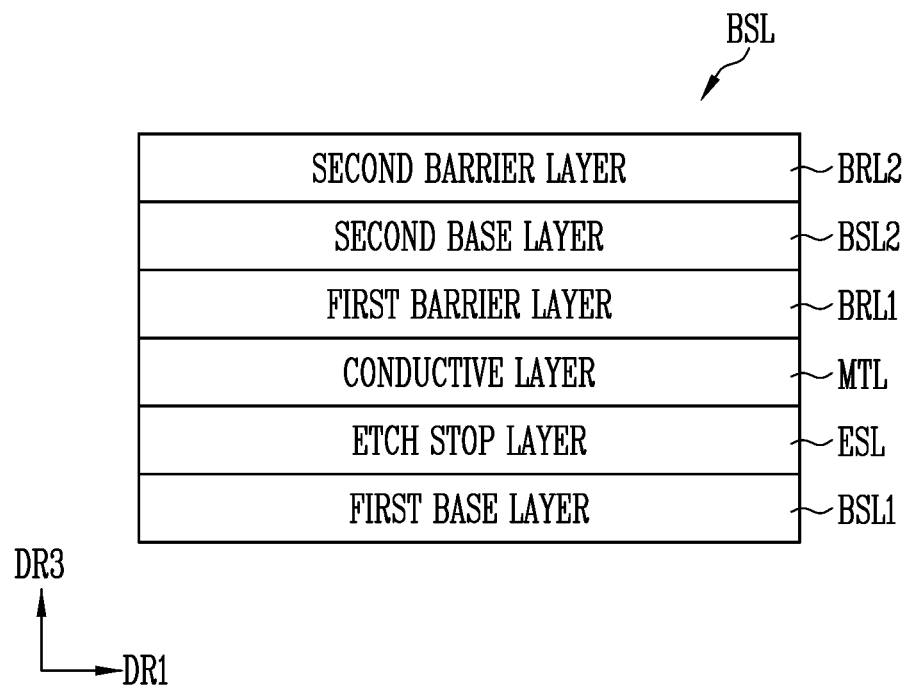
FIG. 3B is a cross-sectional view of a base layer according to an embodiment of the present disclosure.

FIG. 1 is a perspective view illustrating a display device according to an embodiment of the present disclosure. FIGS. 2A and 2B are cross-sectional views illustrating a display device according to one or more embodiments of the present disclosure. FIG. 3A is a cross-sectional view schematically illustrating a configuration of a display panel according to an embodiment of the present disclosure. FIG. 3B is a cross-sectional view of a base layer according to an embodiment of the present disclosure.

First, referring to FIG. 1, the display device DD may include a display area DA, and a non-display area (also referred to as a "bezel area") NA. The display area DA may be an area that includes a plurality of pixels to display an image. The non-display area NA is an area other than the display area DA, and an image may not be displayed at (e.g., in or on) the non-display area NA.

The display area DA may have various suitable shapes, and may include the pixels arranged according to a desired or suitable rule (e.g., a predetermined or certain rule). For example, the display area DA may have various suitable shapes (e.g., various suitable planar shapes), for example, such as a rectangular shape, a circular shape, or an elliptical shape. In addition, the pixels may be arranged at (e.g., in or on) the display area DA according to various suitable arrangement structures, for example, such as a stripe arrangement structure or an RGBG arrangement structure (e.g., a PENTILE® arrangement structure, PENTILE® being a duly registered trademark of Samsung Display Co., Ltd.).

The display area DA may be formed at (e.g., in or on) at least one surface of the display device DD. As an example, the display area DA may be formed at (e.g., in or on) the front surface of the display device DD, and in some embodiments, may be additionally formed at (e.g., in or on) the side surface and/or the rear surface of the display device DD.

The non-display area NA may be positioned around (e.g., to surround around a periphery of) the display area DA, and may optionally include lines, pads, and/or a driving circuit connected to the pixels of the display area DA. When the area of the non-display area NA is reduced, the size of the display area DA may be increased without increasing the size (e.g., the area) of the display device DD. Therefore, a larger screen may be provided. In addition, in the case in which the non-display area NA is reduced, when a multi-screen display device is implemented using a plurality of display devices DD, visual recognition of a boundary between the display devices DD may be reduced or minimized, and a more natural screen may be configured.

The display device DD may be provided in various suitable shapes. As an example, the display device DD may be provided in a rectangular plate shape, but the present disclosure is not limited thereto. For example, the display device DD may have another suitable shape, such as a circular shape or an elliptical shape. In addition, although FIG. 1 illustrates that the display device DD includes an angled corner, the present disclosure is not limited thereto. For example, the display device DD may include a curved or rounded corner.

For convenience of illustration, FIG. 1 shows that the display device DD has the rectangular plate shape including a pair of long sides and a pair of short sides. An extending direction of the long sides is indicated by a first direction DR1, an extending direction of the short sides is indicated by a second direction DR2. A direction perpendicular to or substantially perpendicular to the extending directions of the long sides and the short sides is indicated by a third direction (e.g., a thickness or height direction of the display device DD) DR3. However, the present disclosure is not limited thereto, and the directions DR1, DR2, and DR3 may be variously modified according to the shape of the display device DD.

The display device DD may have a suitable flexibility, so that deformation may occur in at least one area, or may not have a flexibility, so that substantial deformation may not occur in the entire area of the display device DD. In other words, the display device DD may be a flexible display device or a rigid display device. When the display device DD has a suitable flexibility in at least one area, the display device DD may be foldable, bendable, and/or rollable in the at least one flexible area.

Referring to FIG. 2A, the display device DD may include a display panel DP, and a window WD disposed on (e.g., disposed above) the display panel DP. In an embodiment, the window WD may be integrally manufactured with the display panel DP. For example, the window WD may be directly formed on one surface of the display panel DP. In another embodiment, after the window WD is manufactured separately from the display panel DP, the window WD may be connected to (e.g., coupled to or attached to) the display panel DP through an optically clear adhesive (OCA).

The display panel DP includes the pixels for displaying the image, and may be a display panel of various suitable types and/or structures. As an example, the display panel DP may be a self-luminous display panel, for example, such as an organic light emitting display panel (e.g., an OLED panel) that uses organic light emitting diodes as a light emitting element, a nano-scale light emitting diode display panel (e.g., a nano-scale LED panel) that uses nano-scale light emitting diodes, a quantum dot organic light emitting display panel (e.g., a QD OLED panel) that uses organic light emitting diodes and quantum dots, and/or a quantum dot nano-scale light emitting diode display panel (e.g., a QD nano-scale LED panel) that uses nano/micro-scale light emitting diodes and quantum dots. As another example, the display panel DP may be a non-emissive display panel, for example, such as a liquid crystal display panel (e.g., an LCD panel), an electrophoretic display panel (e.g., an EPD panel), and/or an electro-wetting display panel (e.g., an EWD panel). When the non-emissive display panel is used as the display panel DP, the display device DD may further include a separate light source (e.g., a backlight unit, a backlight layer, or a backlight panel) for supplying light to the display panel DP.

The window WD may be provided on the display panel DP to protect an exposed surface of the display panel DP. The window WD may protect the display panel DP from an external impact, and may provide an input surface and/or a display surface to a user.

The window WD may include various suitable materials, for example, such as glass or one or more suitable plastics, and may have a single layer or multiple layers. In addition, the window WD may or may not have flexibility in at least one area. In other words, the window WD may be flexible or may be rigid.

Referring to FIG. 2B, the display device DD may further include a touch sensor TS. In addition, the display device DD may further include input sensing devices or sensors (e.g., a fingerprint sensor, a pressure sensor, a temperature sensor, and/or the like) having various suitable types and/or different schemes.

The touch sensor TS may be disposed on at least one surface of the display panel DP to detect a touch input (e.g., a touch event) by a user. As an example, the touch sensor TS may be provided on the front surface of the display panel DP (e.g., the upper surface thereof on which an image is displayed), so as to be disposed between the display panel DP and the window WD, but the present disclosure is not limited thereto.

In an embodiment, the touch sensor TS may be integrally manufactured with the display panel DP. For example, sensor electrodes and/or sensor elements for configuring the touch sensor TS may be directly formed on at least one surface of the display panel DP.

In another embodiment, the touch sensor TS may be manufactured separately from the display panel DP, and then may be provided around the display panel DP. For example, the touch sensor TS may be disposed and/or attached to at least one surface of the display panel DP.

The touch sensor TS may be a touch sensor of various suitable types and/or structures. For example, the touch sensor TS may be a self-capacitance type or a mutual capacitance type of touch sensor, a resistive type of touch sensor, a piezoelectric type of touch sensor, an ultrasonic type of touch sensor, and/or a hybrid type of touch sensor in which different types of sensors are combined with one another.

When the display device DD includes at least one type of sensor including the touch sensor TS, the display device DD may include a sensing area provided by the sensor. In an embodiment, the sensing area may be disposed at (e.g., in or on) the display area DA, but the present disclosure is not limited thereto.

Referring to FIG. 3A, the display panel DP may include a base layer BSL. The display panel DP may further include a pixel circuit layer PCL, a display element layer DPL, and a thin-film encapsulation layer TFE, which may be sequentially disposed on one surface of the base layer BSL. However, the structure of the display panel DP is not limited thereto. For example, in another embodiment, the display element layer DPL may be first disposed on the one surface of the base layer BSL, and then the pixel circuit layer PCL may be disposed on the display element layer DPL.

Additionally, some elements of the display panel DP may be omitted or replaced with other suitable elements. For example, when the display panel DP is a display panel of a passive display device, the pixel circuit layer PCL may be omitted. In this case, lines for driving the pixels may be directly connected to and/or formed in the display element layer DPL. In addition, according to an embodiment, instead of forming the thin-film encapsulation layer TFE, an upper substrate may be disposed on one side of the base layer BSL. The upper substrate may be bonded to the base layer BSL by a sealing material, for example, such as a frit and/or the like.

The base layer BSL may be a flexible substrate (or a flexible film). In an embodiment, the base layer BSL may be one of a film substrate and/or a plastic substrate including a polymer organic material.

The pixel circuit layer PCL may be disposed on one surface of the base layer BSL. The pixel circuit layer PCL may include circuit elements for configuring a pixel circuit of each pixel, and various lines connected to the circuit elements. For example, the pixel circuit layer PCL may include one or more transistors and one or more storage capacitors constituting (e.g., included in or forming) the pixel circuit of each pixel, and gate lines, data lines, and power lines connected to the pixel circuit(s). According to an embodiment, the gate lines may include at least scan lines, and may optionally further include other types of control lines.

The display element layer DPL may be disposed on the pixel circuit layer PCL. The display element layer DPL may include a light emitting element constituting (e.g., included in or forming) a light source of a pixel. In an embodiment, the light emitting element may be an organic light emitting diode. In another embodiment, the light emitting element may be an inorganic light emitting diode (e.g., a nano/micro-scale inorganic light emitting diode having a size of a nano/micro scale). However, in the present disclosure, the type, structure, shape, and/or size of the light emitting element provided in each pixel is not particularly limited.

The thin-film encapsulation layer TFE may be disposed on the display element layer DPL. The thin-film encapsulation layer TFE may be an encapsulation substrate or a multilayered encapsulation film. When the thin-film encapsulation layer TFE is in the form of the encapsulation film, the thin-film encapsulation layer TFE may include an inorganic film and/or an organic film. For example, the thin-film encapsulation layer TFE may have a multilayered structure in which an inorganic film, an organic film, and an inorganic film are sequentially stacked. The thin-film encapsulation layer TFE may protect the pixels by preventing or reducing external air and/or moisture from penetrating into the display element layer DPL and the pixel circuit layer PCL.

Referring to FIG. 3B, the base layer BSL may have a structure in which a first base layer BSL1, an etch stop layer ESL, a conductive layer MTL, a first barrier BRL1, a second base layer BSL2, and a second barrier layer BRL2 are sequentially stacked.

The first base layer BSL1 and the second base layer BSL2 may include a flexible plastic material. For example, the first base layer BSL1 and the second base layer BSL2 may include polyethersulphone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), and/or cellulose acetate propionate (CAP).

In another embodiment, the first base layer BSL1 and the second base layer BSL2 may include polyimide. However, the present disclosure is not limited thereto. For example, the first base layer BSL1 and the second base layer BSL2 may include different plastic materials from each other.

The first barrier layer BRL1 and the second barrier layer BRL2 may include an inorganic insulating layer. For example, the first barrier layer BRL1 and the second barrier layer BRL2 may include a metal oxide or a metal nitride. For example, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

In another embodiment, the first barrier layer BRL1 and the second barrier layer BRL2 may include the same material as each other or different materials from each other.

In other words, the first barrier layer BRL1 and the second barrier layer BRL2 including one or more inorganic materials may have lower moisture and/or oxygen permeability and mobility than those of the first base layer BSL1 and the second base layer BSL2 including a plastic material. The second base layer BSL2, which may be disposed to be relatively closer to the display element layer DPL than the first base layer BSL1, may be formed so as to be surrounded (e.g., around at least a portion of a periphery thereof) by the first barrier layer BRL1 and the second barrier layer BRL2. Therefore, a passage through which moisture and/or oxygen moves to the display element layer DPL may be blocked or substantially blocked (e.g., may be completely blocked).

According to an embodiment of the present disclosure, the etch stop layer ESL and the conductive layer MTL may be included between the first base layer BSL1 and the first barrier layer BRL1.

The etch stop layer ESL may include an inorganic semiconductor, for example, such as silicon. In another embodiment, the etch stop layer ESL may include amorphous silicon (a-Si). In this case, the etch stop layer ESL may prevent or substantially prevent lines included in the base layer BSL, the pixel circuit layer PCL, and the display element layer DPL from being damaged by a laser irradiated from the bottom of the first base layer BSL1, which will be described in more detail below.

The conductive layer MTL may be formed between the etch stop layer ESL and the first barrier layer BRL1. According to an embodiment, the conductive layer MTL may include a second line LI2 (e.g., second gate lines GL_R and second data lines DL_R), which will be described in more detail below.

Figure 4:
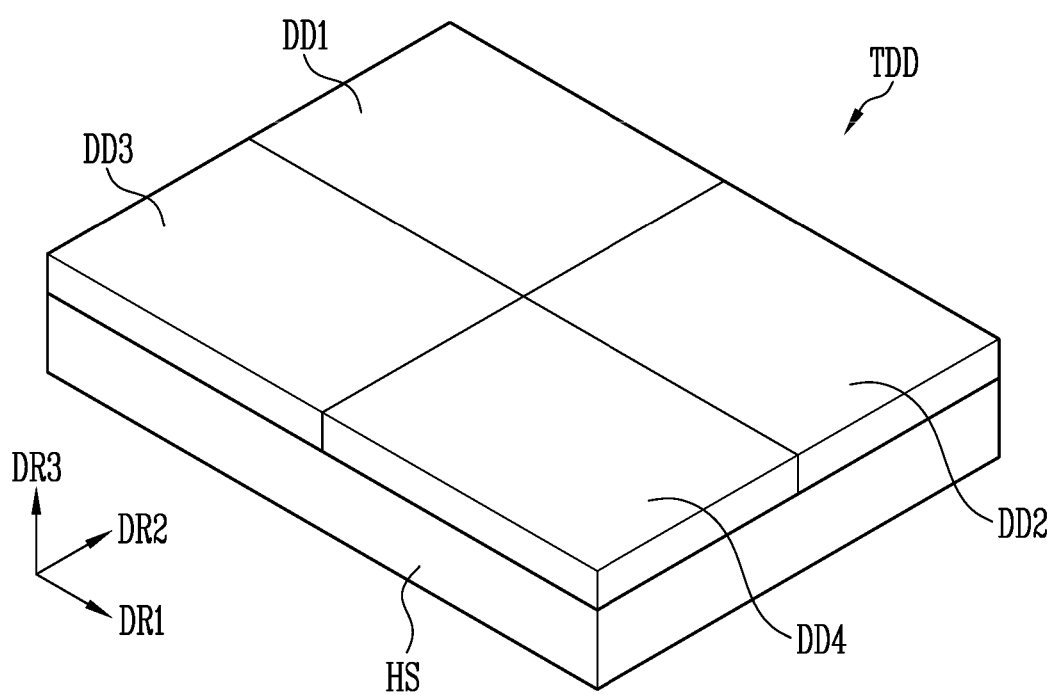
FIG. 4 is a perspective view illustrating a multi-screen display device according to an embodiment of the present disclosure.
Figure 5A:
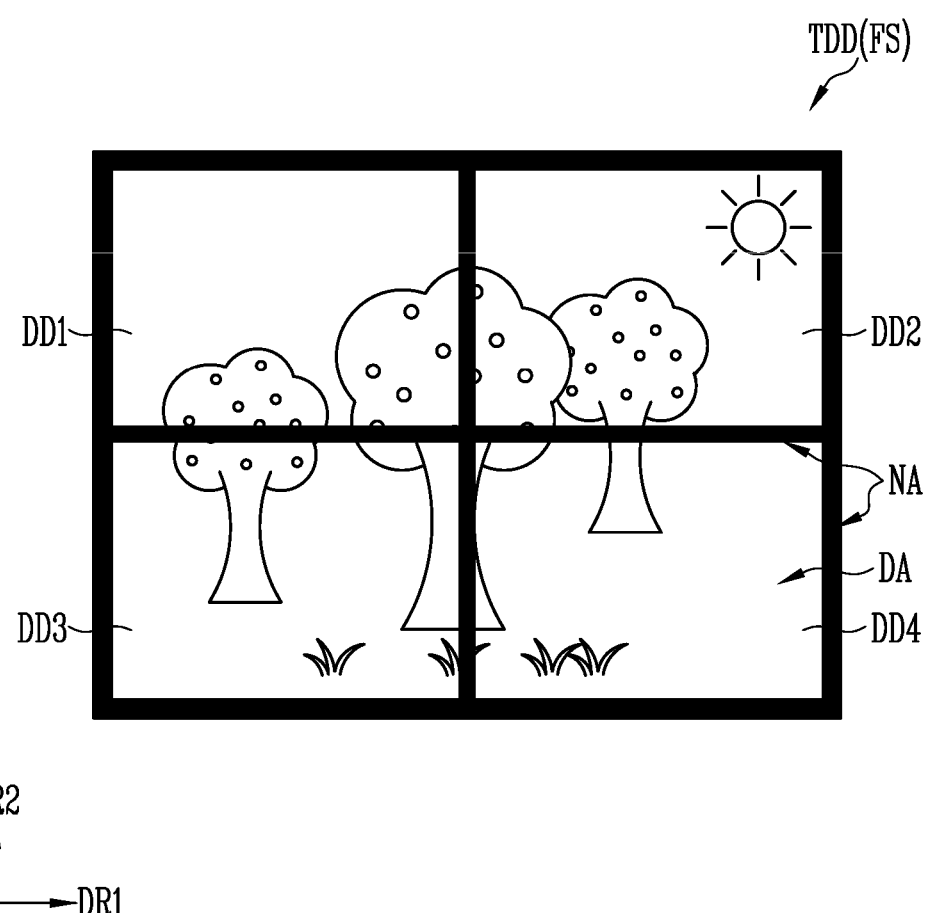
FIGS. 5A-5B are plan views illustrating the multi-screen display device according to one or more embodiments of the present disclosure, and for example, illustrate a front surface (e.g., a display surface) of the multi-screen display device of FIG. 4.
Figure 5B:
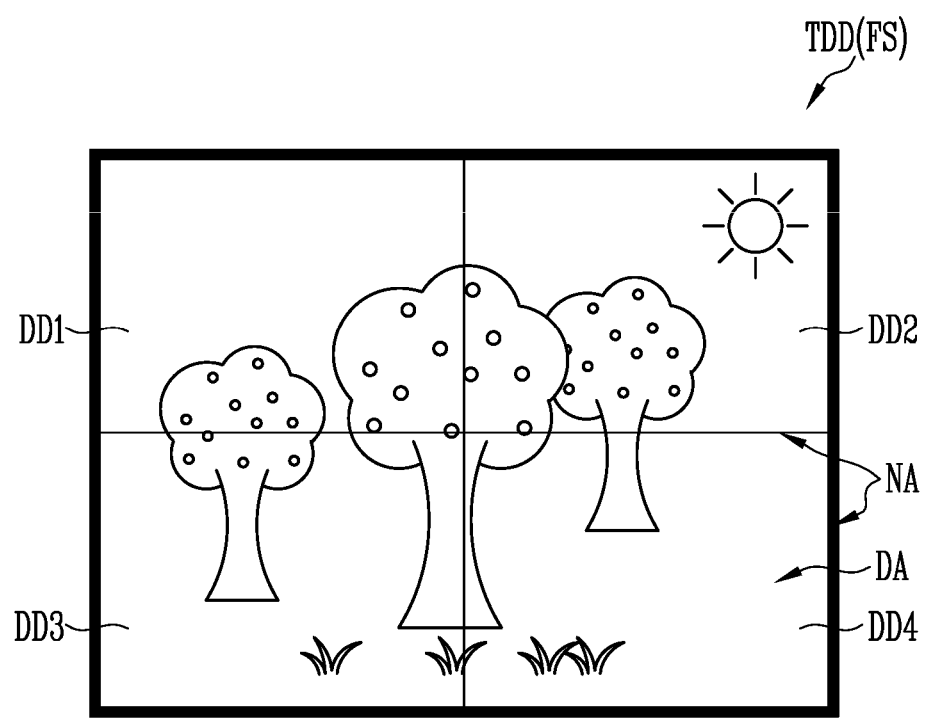

FIG. 4 is a perspective view illustrating a multi-screen display device according to an embodiment of the present disclosure. FIGS. 5A and 5B are plan views illustrating the multi-screen display device according to one or more embodiments of the present disclosure, and for example, illustrate a front surface (e.g., a display surface) of the multi-screen display device of FIG. 4.

First, referring to FIG. 4, the multi-screen display device TDD (also referred to as a "tiled display") may include a plurality of display devices DD1 to DD4, and a housing HS. For example, the multi-screen display device TDD may include the plurality of display devices DD1 to DD4 arranged in a matrix form along the first direction DR1 and/or the second direction DR2.

The display devices DD1 to DD4 may each display individual images, and/or may divide one image and display the divided images together. In an embodiment, the display devices DD1 to DD4 may include display panels of the same or substantially the same type, structure, size, and/or scheme as each other, but the present disclosure is not limited thereto.

The housing HS physically connects the display devices DD1 to DD4 to each other, so that the display devices DD1 to DD4 may constitute (e.g., may be included in or may form) one multi-screen display device TDD. For example, the housing HS may have a fastening member and/or a groove structure under (e.g., underneath) the display devices DD1 to DD4 for supporting the display devices DD1 to DD4, and for stably fixing the display devices DD1 to DD4.

Referring to FIGS. 5A and 5B, the display devices DD1 to DD4 display an image at (e.g., in or on) only each of the display areas DA thereof. Therefore, the image displayed on the screen of the multi-screen display device TDD may be disconnected due to the non-display area NA (e.g., a seam area) located at (e.g., in or on) a boundary area between the display devices DD1 to DD4.

In more detail, as illustrated in FIG. 5A, when the width and/or the area (e.g., the size) of the non-display area NA of each of the display devices DD1 to DD4 is relatively large, a sense of disconnection in the image may be increased in the boundary area between the display devices DD1 to DD4.

On the other hand, as illustrated in FIG. 5B, when the width and/or the area (e.g., the size) of the non-display area NA of the display devices DD1 to DD4 is reduced, or when the non-display area NA is removed or substantially removed (e.g., is omitted), it may be possible to prevent or alleviate a visual recognition of the boundary area between the display devices DD1 to DD4, and to display an image that continues more naturally even at (e.g., in or on) the boundary area. Therefore, the sense of the disconnection in the image displayed on the screen of the multi-screen display device TDD may be prevented or alleviated, and a more natural looking screen may be configured.

In this regard, one or more embodiments of the present disclosure are directed to a method for reducing or minimizing the non-display area NA of the display device DD (and in particular, the display panel DP), which will be described in more detail through the following embodiments.

Figure 6A:
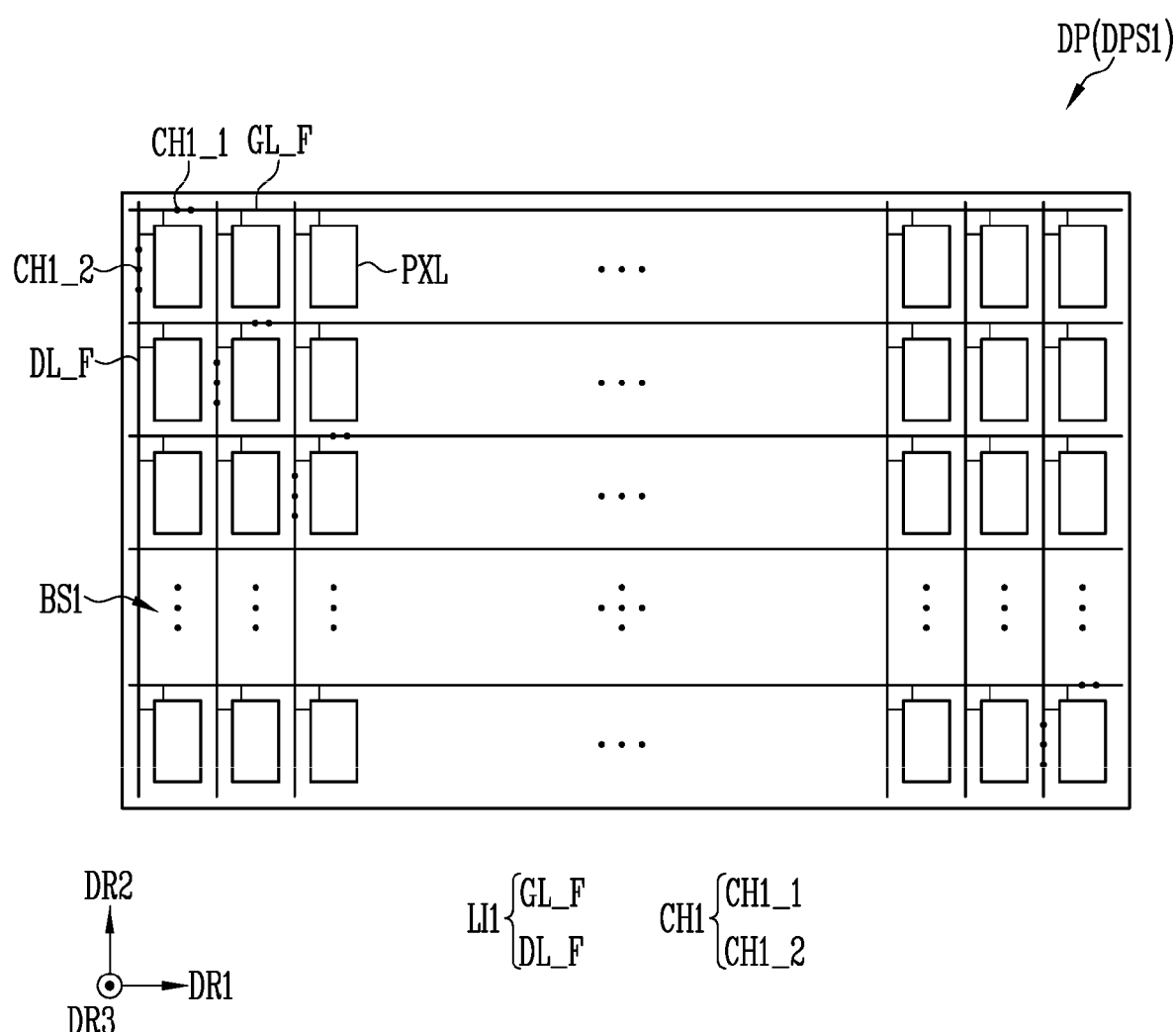
FIGS. 6A-6C are plan views illustrating a display panel according to one or more embodiments of the present disclosure.
Figure 6B:
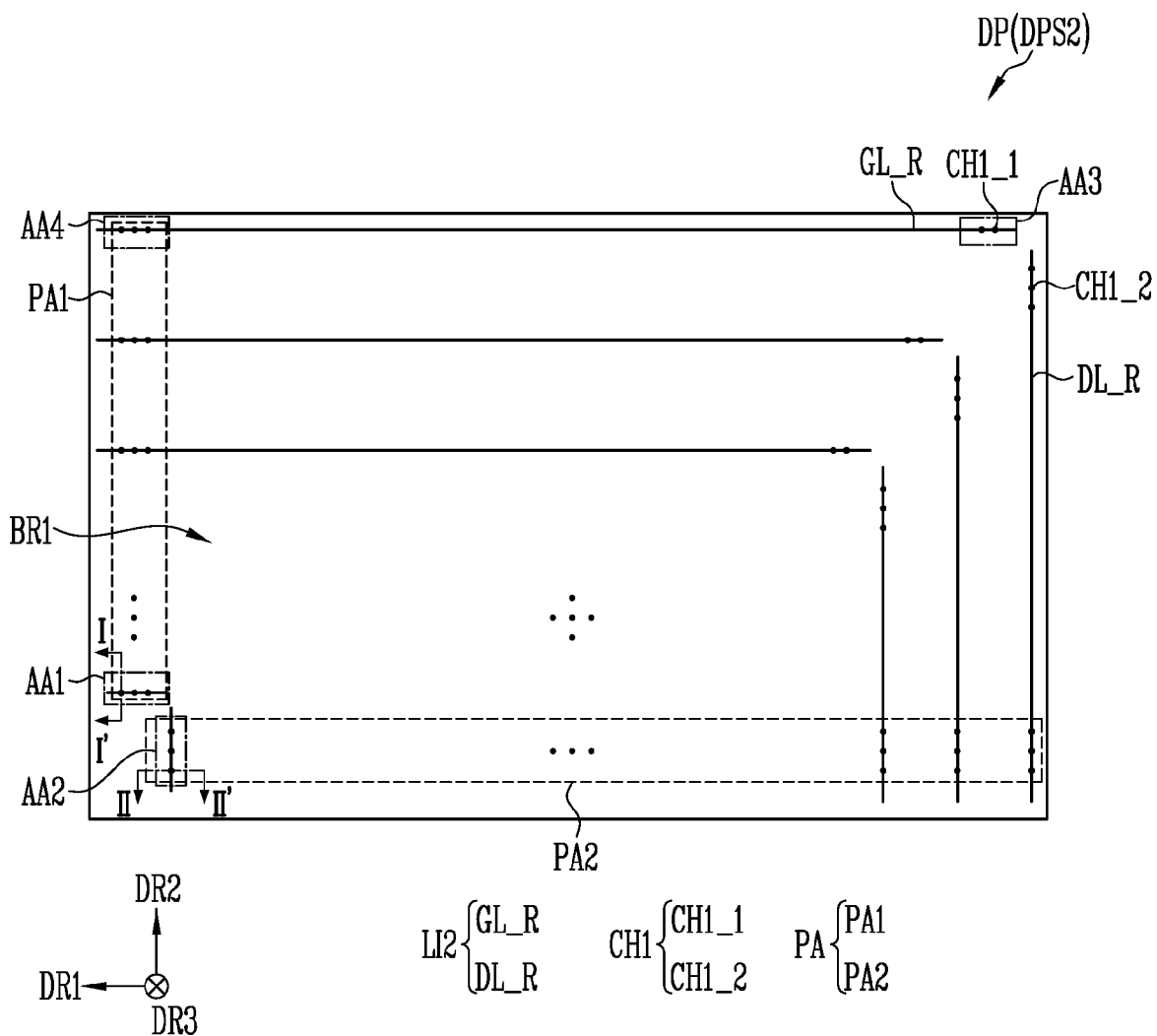
Figure 6C:
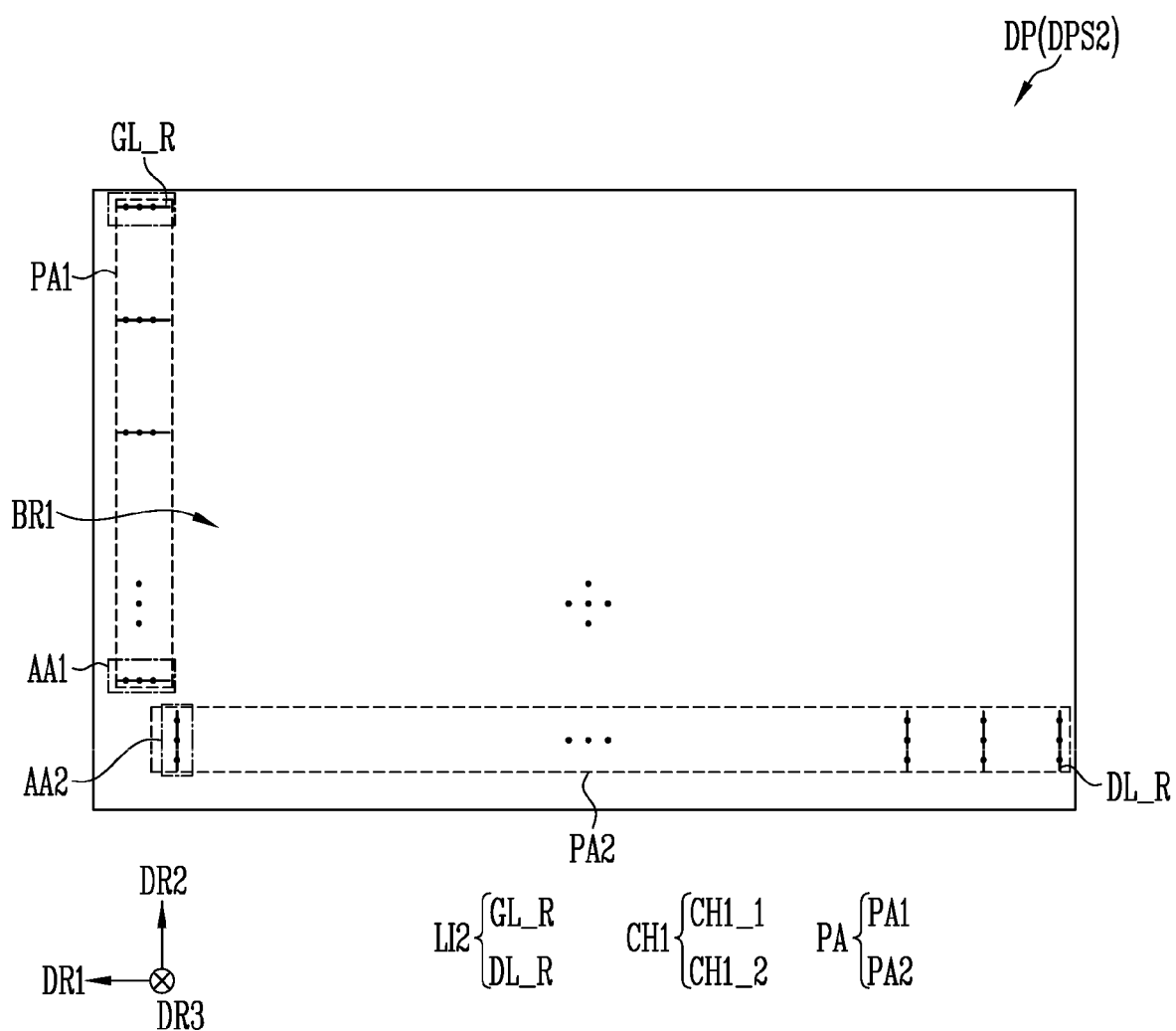

FIGS. 6A to 6C are plan views illustrating a display panel according to one or more embodiments of the present disclosure. As an example, FIG. 6A illustrates a first surface DPS1 of the display panel DP, and FIGS. 6B and 6C illustrate a second surface DPS2 of the display panel DP. The first surface DPS1 of the display panel DP may be the display surface on which an image is displayed, and may be the front surface of the display panel DP. The first surface DPS1 of the display panel DP may include the display area (e.g., the display area DA of FIG. 1) at (e.g., in or on) which the pixels PXL are disposed. The second surface DPS2 of the display panel DP may be one surface (e.g., the lower surface) of the first barrier layer BRL1 illustrated in FIG. 3B.

For example, the second surface DPS2 of the display panel DP may be an area covered by the first base layer BSL1 and the etch stop layer ESL.

In the case of the display panel DP illustrated in FIGS. 6A to 6C, as the non-display area (e.g., the non-display area NA in FIG. 1) is reduced or minimized (e.g., is removed or omitted) at (e.g., in or on) the first surface DPS1 of the display panel DP according to the present embodiment of the present disclosure, the entire area of the first surface DPS1 of the display panel DP, excluding the outermost edge area thereof, may be considered to correspond to the display area DA. Therefore, in FIGS. 6A to 6C, the display area DA and the non-display area NA may not be distinguishable from each other.

FIGS. 6A and 6B illustrate that first lines LI1 and second lines LI2 disposed on the first surface DPS1 and the second surface DPS2 of the display panel DP, respectively, appear to have a lateral symmetrical shape with each other. However, this may be due to a difference in a viewpoint when the display panel DP is viewed from above and a viewpoint when the display panel DP is viewed from below. For example, an area at (e.g., in or on) the left side of the first surface DPS1 of the display panel DP shown in FIG. 6A may correspond to (e.g., may overlap with) an area at (e.g., in or on) the right side of the second surface DPS2 of the display panel DP shown in FIG. 6B.

Referring to FIGS. 1 to 6A, the first surface DPS1 of the display panel DP corresponds to a first surface BS1 (e.g., see FIG. 8) of the base layer BSL, which may correspond to a surface (e.g., an upper surface) of the base layer BSL (e.g., an upper surface of the second barrier layer BRL2 of the base layer BSL). The pixels PXL and the first lines LI1 disposed on the first surface BS1 of the base layer BSL may be included. For example, the pixels PXL arranged according to a suitable rule (e.g., a predetermined or certain rule), and the first lines LI1 connected to the pixels PXL may be formed on the first surface BS1 of the base layer BSL.

According to an embodiment, the first lines LI1 may collectively refer to various lines provided on the first surface DPS1 of the display panel DP. For example, the first lines LI1 may include first gate lines GL_F (also referred to as "front gate lines") and first data lines DL_F (also referred to as "front data lines") that are connected to the pixels PXL, so as to drive the pixels PXL. In addition, the first lines LI1 may further include power lines for supplying a driving power to the pixels PXL. For example, the first lines LI1 may further include a first front power line and a second front power line for supplying a high-potential pixel power and a low-potential pixel power, respectively, to the pixels PXL.

The first gate lines GL_F may extend in the first direction DR1, and may be sequentially arranged along the second direction DR2. In an embodiment, the first direction DR1 may be a row direction (or a horizontal direction), and the second direction DR2 may be a column direction (or a vertical direction), but the present disclosure is not limited thereto.

The first gate lines GL_F may include scan lines, each of the scan lines connected to the pixels PXL of a corresponding pixel row (e.g., a corresponding horizontal line). In addition, the first gate lines GL_F may optionally further include other control lines (e.g., front sensing signal lines) for controlling the driving timing of the pixels PXL.

The first data lines DL_F extend in a different direction from that of the first gate lines GL_F, and may cross the first gate lines GL_F. For example, the first data lines DL_F may extend in the second direction DR2, and may be sequentially arranged along the first direction DR1. The first data lines DL_F may include data lines, each of the data lines connected to the pixels PXL of a corresponding pixel column (e.g., a corresponding vertical line).

However, the present disclosure is not limited thereto, and the extending direction and/or the arrangement structure of the first gate lines GL_F and the first data lines DL_F are not particularly limited, and thus, may be variously modified as needed or desired according to embodiments. For example, the extending/arranging directions of the first gate lines GL_F and the first data lines DL_F may be modified to be in reverse, or at least one of the first gate lines GL_F and the first data lines DL_F may be formed in a mesh structure.

In addition, according to an embodiment, the first lines LI1 may further include other signal lines disposed to be parallel to or substantially parallel to the first data lines DL_F. For example, the first lines LI1 may further include front sensing lines that extend in the second direction DR2, like the first data lines DL_F, and are sequentially arranged along the first direction DR1.

According to an embodiment, at least one first contact hole CH1 may be formed for each of the first gate lines GL_F in areas overlapping with the first gate lines GL_F in the third direction DR3, and/or at least one first contact hole CH1 may be formed for each of the first data lines DL_F in areas overlapping with the first data lines DL_F in the third direction DR3. For example, at least one (1-1)-th contact hole CH1_1 may be formed for each of the first gate lines GL_F in the areas overlapping with the first gate lines GL_F in the third direction DR3, and at least one (1-2)-th contact hole CH1_2 may be formed for each of the first data lines DL_F in the areas overlapping with the first data lines DL_F in the third direction DR3. The first contact holes CH1 may be formed to be connected to the first gate line GL_F or the first data line DL_F in the area overlapping with the first gate line GL_F or the first data line DL_F.

For example, a number of the (1-1)-th contact holes CH1_1 formed for each of the first gate lines GL-F in the areas overlapping with the first gate lines GL_F in the third direction DR3 may be equal to or different from a number of the (1-2)-th contact holes CH1_2 formed for each of the first data lines DL_F in the areas overlapping with the first data lines DL_F in the third direction DR3. For example, two (1-1)-th contact holes CH1_1 may be formed for each of the first gate lines GL_F in the areas overlapping with the first gate lines GL_F in the third direction DR3, and two (1-2)-th contact holes CH1_2 may be formed for each of the first data lines DL_F in the areas overlapping with the first data lines DL_F in the third direction DR3.

While FIG. 6A illustrates an embodiment in which a plurality of (1-1)-th contact holes CH1_1 and/or a plurality of (1-2)-th contact holes CH1_2 are formed for the first gate lines GL_F and/or the first data lines DL_F, and the plurality of (1-1)-th contact holes CH1_1 and/or the plurality of (1-2)-th contact holes CH1_2 are disposed to be adjacent to each other, the present disclosure is not limited thereto. In other words, the arrangement structures and/or positions of the first contact holes CH1 may be variously modified as needed or desired according to embodiments.

Referring to FIG. 6B, the second surface DPS2 of the display panel DP corresponds to one surface BR1 (e.g., see FIG. 8) of the first barrier layer BRL1, which may correspond to the lower surface of the first barrier layer BRL1, and may include the second lines LI2 disposed on the one surface BR1 of the first barrier layer BRL1, and a pad area PA exposing an area (e.g., a part) of the second lines LI2. The second lines LI2 may be formed and/or disposed to correspond to (e.g., to at least partially overlap with) the first lines LI1 disposed on the one surface BS1 of the base layer BSL. As an example, each of the second lines LI2 may be formed at a position corresponding to (e.g., overlapping with) a corresponding one of the first lines LI1, so as to be connected to the corresponding one of the first lines LI1.

According to an embodiment, the second lines LI2 may include various lines disposed on the second surface DPS2 of the display panel DP. Each of the second lines LI2 may be connected to a corresponding one of the first lines LI1 through at least one first contact hole CH1. For example, each of the second lines LI2 may overlap with a corresponding one of the first lines LI1 at (e.g., in or on) an area in which at least one first contact hole CH1 is formed, and may be connected to the corresponding one of the first lines LI1 through the at least one first contact hole CH1.

The second lines LI2 may include second gate lines GL_R (also referred to as "rear gate lines"), and second data lines DL_R (also referred to as "rear data lines"). The second gate lines GL_R may be connected to the first gate lines GL_F through at least one (1-1)-th contact hole CH1_1, and the second data lines DL_R may be connected to the first data lines DL_F through at least one (1-2)-th contact hole CH1_2.

For example, the second gate lines GL_R may overlap with the first gate lines GL_F corresponding thereto at (e.g., in or on) an area in which at least one (1-1)-th contact hole CH1_1 is formed, and may be connected to the first gate lines GL_F through the at least one (1-1)-th contact hole CH1_1. Similarly, the second data lines DL_R may overlap with the first data lines DL_F corresponding thereto at (e.g., in or on) an area in which at least one (1-2)-th contact hole CH1_2 is formed, and may be connected to the first data lines DL_F through the at least one (1-2)-th contact hole CH1_2.

However, the arrangement of the second gate lines GL_R and the second data lines DL_R is not limited thereto. For example, as illustrated in FIG. 6C, the second gate lines GL_R may be formed only at (e.g., in or on) the first pad area PA1 to correspond to the first gate lines GL_F. In addition, the second data lines DL_R may be formed only at (e.g., in or on) the second pad area PA2 to correspond to the first data lines DL_F.

In addition, the second lines LI2 may further include power lines for supplying a driving power to the pixels PXL, and/or additional signal lines for detecting characteristic information of the pixels PXL. As an example, the second lines LI2 may further include a rear power line connected to the first front power line, a second rear power line connected to the second front power line, and/or rear sensing lines connected to the front sensing lines.

The etch stop layer ESL may be formed on one surface (e.g., the rear portion) of the second line LI2 and the first barrier layer BRL1, and the first base layer BSL1 may be formed on the etch stop layer ESL. The second lines LI2 may be connected to the driving circuits (e.g., a gate driver and/or a data driver) through pads in the pad area PA. A structure in which the second lines LI2 and the driving circuit are connected to each other will be described in more detail below with reference to FIG. 8.

The second gate lines GL_R may be connected to a first connection film (e.g., a COF-type first connection film) on which the gate driver is connected (e.g., mounted) through the first pad area PA1, and the second data lines DL_R may be connected to a second connection film (e.g., a COF-type second connection film) on which the data driver (and/or a sensing unit or a sensing driver) is connected (e.g., mounted) through the second pad area PA2. When the second lines LI2 further include the first and second rear power lines, the first and second rear power lines may be connected to the power driver through other pad areas.

In an embodiment, the first connection film and the second connection film may be separate connection films that are spaced apart (e.g., that are separated) from each other, but the present disclosure is not limited thereto. For example, in another embodiment, the gate driver and the data driver may be mounted together on one connection film.

The pad area PA may include the first pad area PA1 corresponding to the second gate lines GL_R, and the second pad area PA2 corresponding to the second data lines DL_R. In addition, when the second lines LI2 further include additional rear lines (e.g., the first and second rear power lines and/or the rear sensing lines) in addition to the second gate lines GL_R and the second data lines DL_R), the pad area PA may further include a pad area corresponding to the additional rear lines.

In the embodiments of FIGS. 6A and 6B, the first contact holes CH1 may be distributed in the display area DA at (e.g., in or on) which the pixels PXL are arranged. As an example, the first contact holes CH1 may be uniformly or substantially uniformly distributed in the first surface BS1 and the second surface BS2 of the base layer BSL. Therefore, a physical impact due to the formation of the first contact holes CH1 may be dispersed or relieved, and a mechanical strength of the display panel DP may be improved. In addition, when the first contact holes CH1 are disposed in the display area DA, the non-display area NA of the display device DD may be reduced or minimized at (e.g., in or on) the display surface of the display panel DP, or in other words, the first surface DPS1.

In addition, in the above-described embodiments, the pad area PA and/or the connection films connected thereto may be provided on the second surface BS2 of the base layer BSL to overlap with the display area DA. In this case, when viewed from the first surface DPS1 of the display panel DP (e.g., in a plan view), the non-display area NA of the display device DD may be reduced or minimized (e.g., may be removed or substantially removed, or may be omitted). Therefore, the non-display area NA of the display device DD may be reduced or minimized.

When the multi-screen display device TDD is configured using the display devices DD in which the non-display area NA is reduced or minimized according to the embodiments of the present disclosure, the seam area that may be formed between the display devices DD may be reduced or removed, and an image that naturally continues even in the boundary area between the display devices DD may be displayed. Therefore, it may be possible to easily manufacture multi-screen display devices TDD having various suitable sizes by using the display devices DD according to the embodiments of the present disclosure.

For example, in the case of manufacturing a super-large display device having a screen size of 110 inches or more, when a multi-screen display device TDD including a screen having a corresponding area is manufactured by using the display devices DD in which the non-display area NA is reduced or minimized according to the embodiments of the present disclosure, it may be possible to more easily manufacture the super-large display device at a lower cost when compared to a case of manufacturing the super-large display device as a single display device including a screen having the same or substantially the same screen size. In addition, when the display devices DD according to the embodiments of the present disclosure are applied, it may be possible to alleviate or prevent a visual recognition of the boundary area between the display devices DD constituting the multi-screen display device TDD, and thus, a more natural screen may be configured even in the multi-screen display device TDD.

Figure 7:
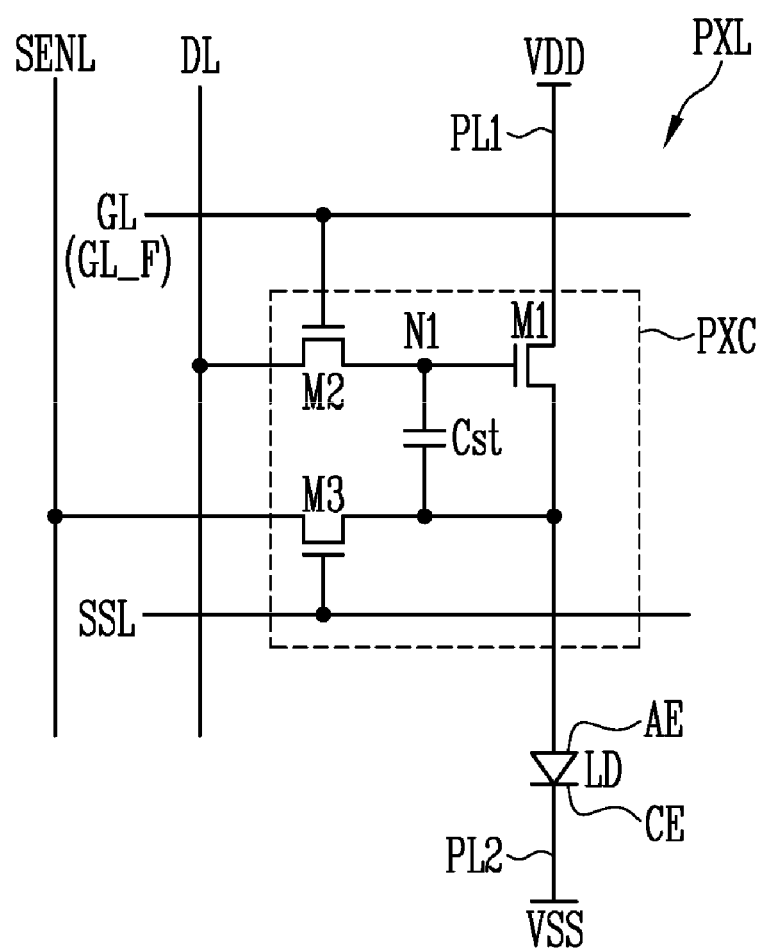
FIG. 7 illustrates a pixel according to an embodiment of the present disclosure.

FIG. 7 illustrates a pixel PX according to an embodiment of the present disclosure.

Referring to FIG. 7, the pixel PX may include a light emitting element LD connected between a first power supply voltage VDD and a second power supply voltage VSS, and may optionally further include a pixel circuit PXC for driving the light emitting element LD.

The pixel circuit PXC may be connected between the first power supply voltage VDD and the light emitting element LD. In addition, the pixel circuit PXC may be connected to a gate line GL (e.g., the first gate line GL_F) and a data line DL (e.g., the first data line DL_F) of the pixel PX to control the operation of the light emitting element LD in response to a scan signal and a data signal supplied from the gate line GL and the data line DL, respectively. In addition, the pixel circuit PXC may be optionally further connected to a sensing signal line SSL, and a sensing line SENL.

As used herein, the term "connection (or coupling)" may comprehensively mean a physical and/or an electrical connection (or coupling). In addition, the term "connection (or coupling)" may comprehensively mean a direct or indirect connection (or coupling), and an integrated or non-integrated connection (or coupling).

The pixel circuit PXC may include at least one transistor, and a capacitor. For example, the pixel circuit PXC may include a first transistor M1, a second transistor M2, a third transistor M3, and a storage capacitor Cst.

The first transistor M1 is connected between the first power supply voltage VDD and a first electrode AE (e.g., an anode electrode) of the light emitting element LD. A gate electrode of the first transistor M1 is connected to a first node N1. The first transistor M1 controls a driving current that is supplied to the light emitting element LD in response to the voltage of the first node N1. In other words, the first transistor M1 may be a driving transistor that controls the driving current of the pixel PX.

In an embodiment, the first transistor M1 may optionally further include a back gate electrode. The gate electrode and the back gate electrode of the first transistor M1 may overlap with each other with an insulating layer therebetween.

The second transistor M2 is connected between the data line DL and the first node N1. A gate electrode of the second transistor M2 is connected to the gate line GL. The second transistor M2 is turned on when a scan signal having a gate-on voltage (e.g., a high level voltage) is supplied from the gate line GL, and electrically connects the data line DL to the first node N1.

A data signal of a corresponding frame is supplied to the data line DL during each frame period, and the data signal is transmitted to the first node N1 through the second transistor M2 that is turned on during a period in which the scan signal of the gate-on voltage is supplied. In other words, the second transistor M2 may be a switching transistor for transmitting the data signal to the pixel PX.

One electrode of the storage capacitor Cst is connected to the first node N1, and the other electrode of the storage capacitor Cst is connected to a second electrode of the first transistor M1. The storage capacitor Cst charges a voltage corresponding to the data signal supplied to the first node N1 during each frame period.

The third transistor M3 is connected between the first electrode AE of the light emitting element LD (and/or the second electrode of the first transistor M1) and the sensing line SENL. A gate electrode of the third transistor M3 is connected to the sensing signal line SSL. The third transistor M3 may transmit, to the sensing line SENL, a voltage value applied to the first electrode AE of the light emitting element LD according to a sensing signal supplied to the sensing signal line SSL during a sensing period (e.g., a predetermined sensing period). The voltage value transmitted through the sensing line SENL may be provided to an external circuit (e.g., a timing controller), and the external circuit may extract characteristic information (e.g., a threshold voltage of the first transistor M1, and/or the like) of each pixel PX based on the provided voltage value. The extracted characteristic information may be used to convert image data, so that characteristic deviations (e.g., characteristic variations) between the pixels PX are compensated for.

Although FIG. 7 illustrates that the transistors included in the pixel circuit PXC, for example, the first, second, and third transistors M1, M2, and M3, are all N-type transistors, the present disclosure is not limited thereto. In other words, at least one of the first, second, and third transistors M1, M2, and M3 may be modified to a P-type transistor. In another embodiment, the pixel circuit PXC may include a combination of P-type and N-type transistors.

In addition, the structure and driving method of the pixel PX may be variously modified. For example, the pixel circuit PXC may include pixel circuits having various suitable structures and/or driving methods, in addition to the embodiment illustrated in FIG. 7.

For example, the pixel circuit PXC may not include the third transistor M3. In addition, the pixel circuit PXC may further include other circuit elements, for example, such as a compensation transistor for compensating the threshold voltage of the first transistor M1, an initialization transistor for initializing the voltage of the first node N1 or the voltage of the first electrode AE of the light emitting element LD, an emission control transistor for controlling a period in which the driving current is supplied to the light emitting element LD, a boosting capacitor for boosting the voltage of the first node N1, and/or the like.

The light emitting element LD includes the first electrode AE connected to the first power supply voltage VDD through the pixel circuit PXC and a first power line PL1, and a second electrode CE connected to the second power supply voltage VSS through a second power line PL2. In addition, the light emitting element LD includes an organic emission layer between the first electrode AE and the second electrode CE.

The first power supply voltage VDD and the second power supply voltage VSS may have different potentials from each other, so that the light emitting element may emit light. As an example, the first power supply voltage VDD may be set as a high potential voltage, and the second power supply voltage VSS may be set as a low potential voltage. In this case, the first electrode AE of the light emitting element LD may be the anode electrode, and the second electrode CE of the light emitting element LD may be a cathode electrode.

When the driving current is supplied from the pixel circuit PXC, the light emitting element LD generates light having a desired luminance corresponding to the driving current. Therefore, each pixel PX emits light having a desired luminance corresponding to a data signal supplied to the first node N1 of a corresponding pixel circuit PXC thereof during each frame period. When a data signal corresponding to a black gray scale (e.g., a black gray level) is supplied to the first node N1 during a frame period, the pixel circuit PXC may not supply the driving current to the light emitting element LD, and thus, the pixel PX may maintain or substantially maintain a non-emission state during the frame period.

Figure 8:
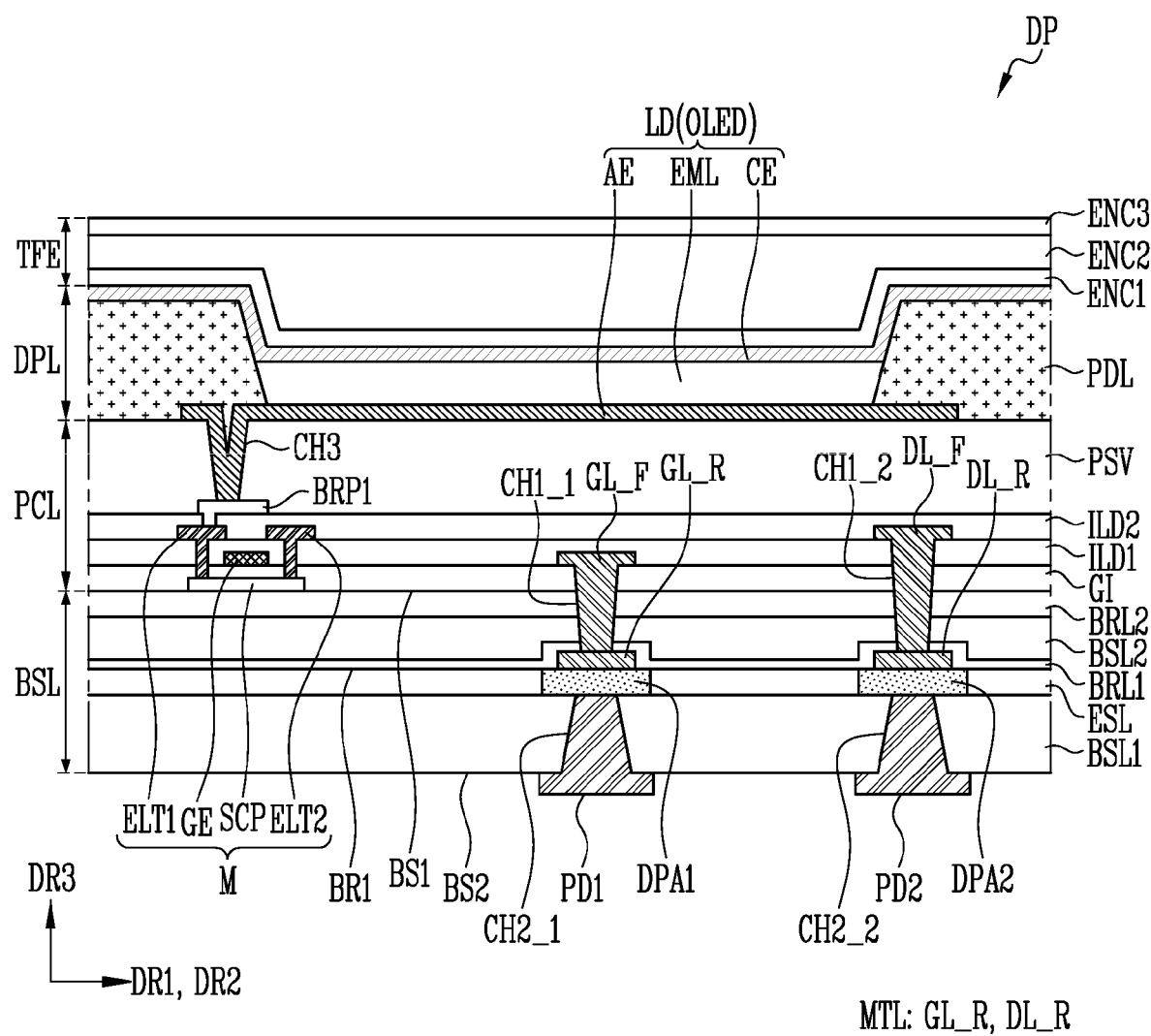
FIG. 8 is a cross-sectional view of the display panel taken along the line I-I' or the line II-II' of FIG. 6B.
Figure 9A:
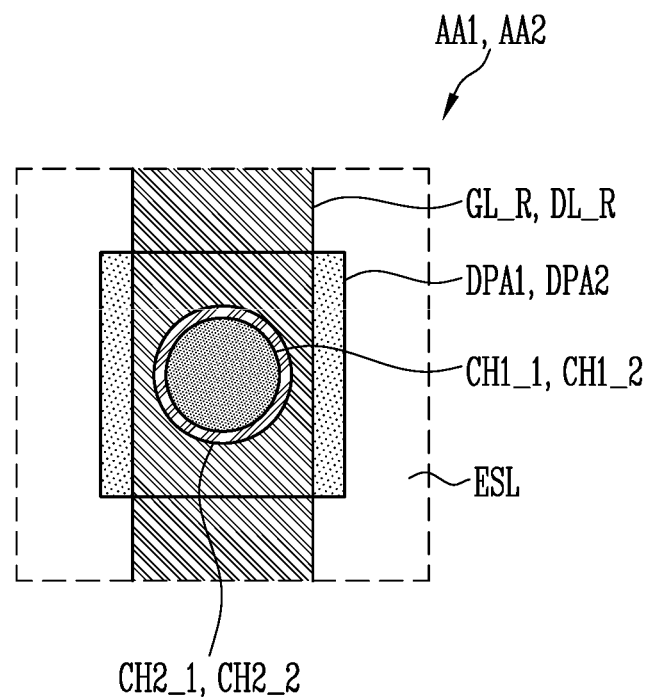
FIG. 9A is a plan view showing a contact hole formed in the area AA1 or the area AA2 of FIG. 6B.
Figure 9B:
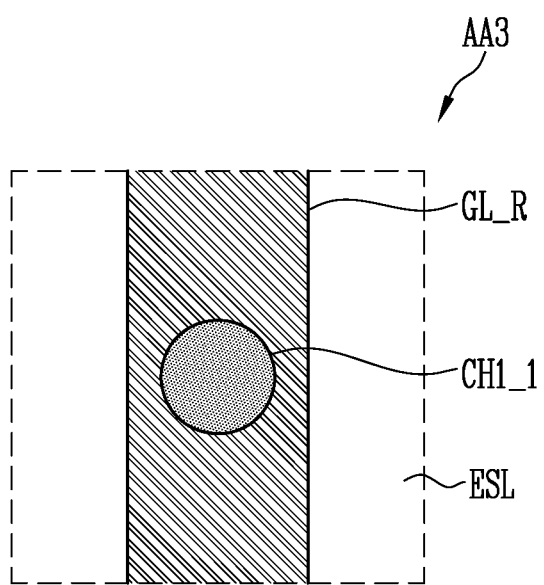
FIG. 9B is a plan view illustrating a contact hole formed in the area AA3 of FIG. 6B.
Figure 9C:
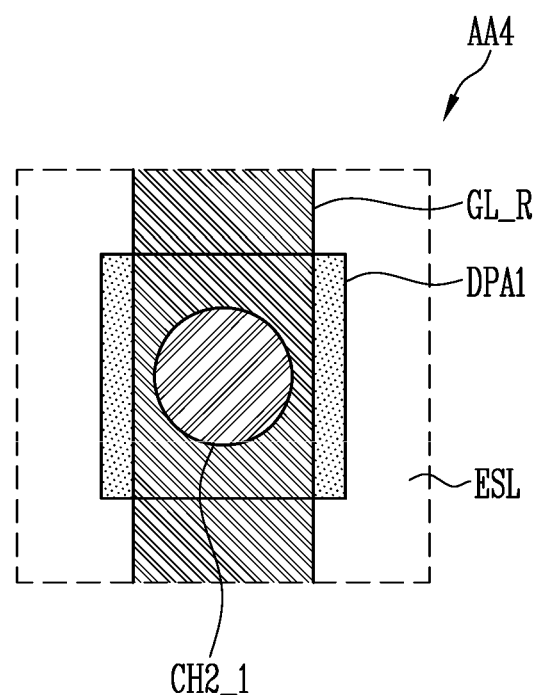
FIG. 9C is a plan view illustrating a contact hole formed in the area AA4 of FIG. 6B.
Figure 10A:
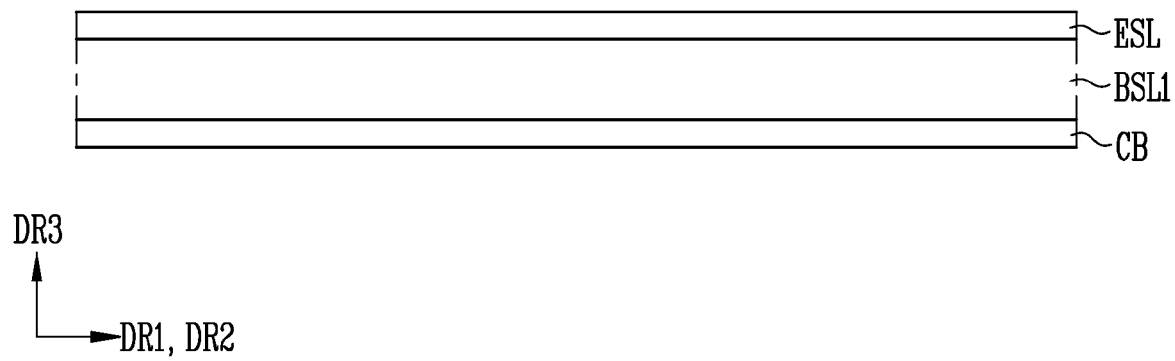
FIGS. 10A-10G are cross-sectional views sequentially illustrating various processes of a method for manufacturing a display device according to an embodiment of the present disclosure.
Figure 10B:
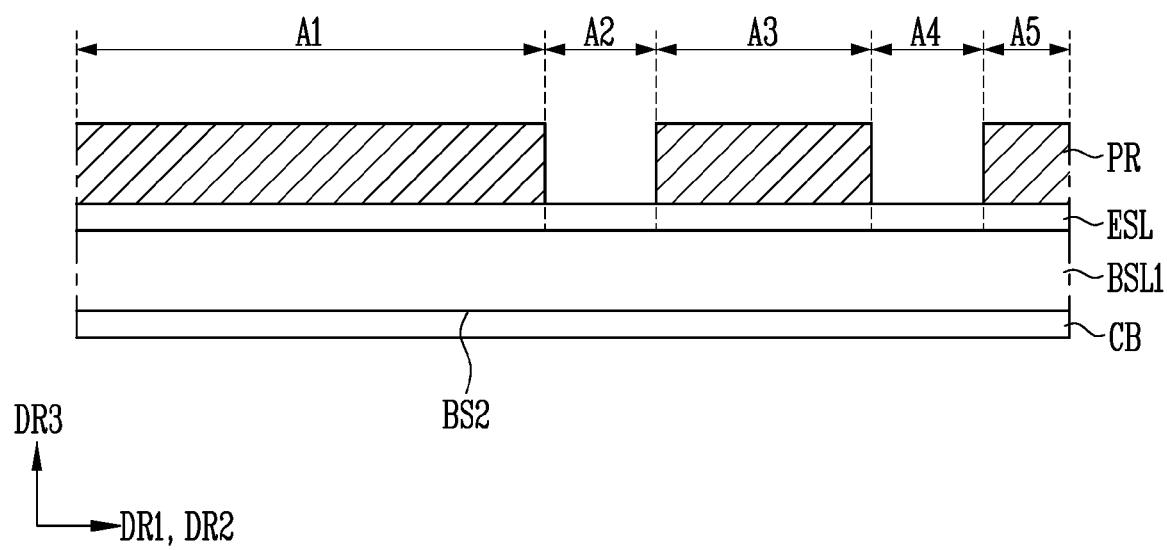
Figure 10C:
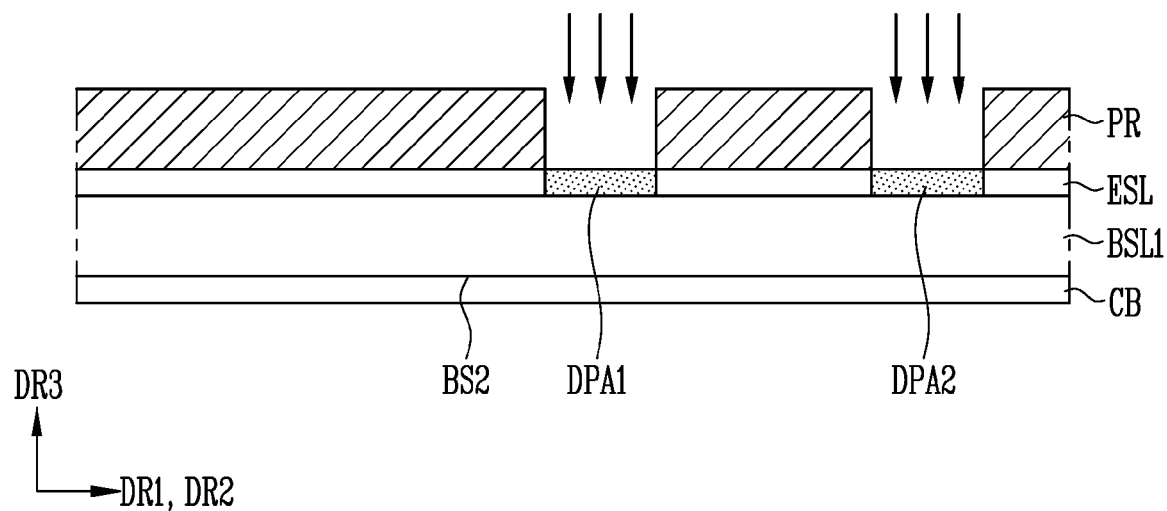
Figure 10D:
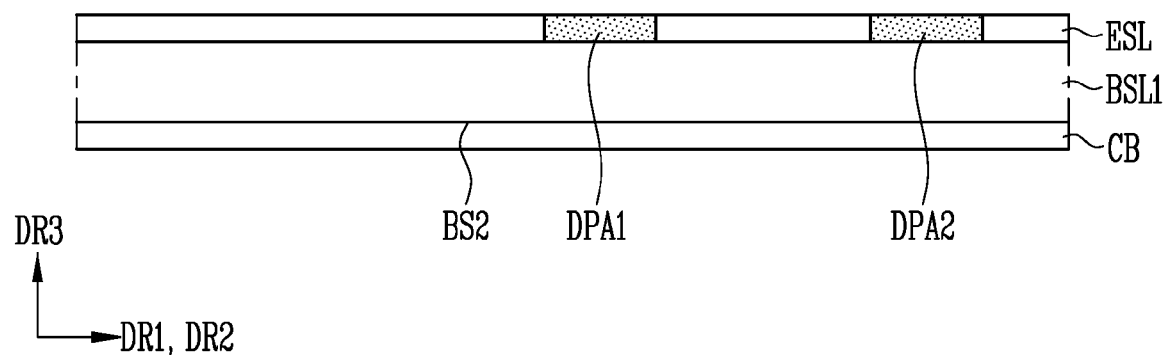
Figure 10E:
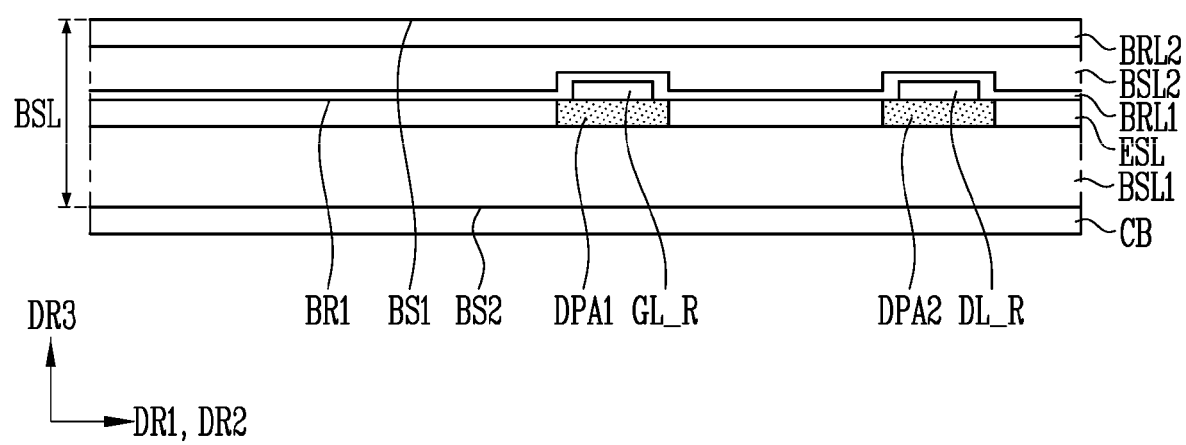
Figure 10F:
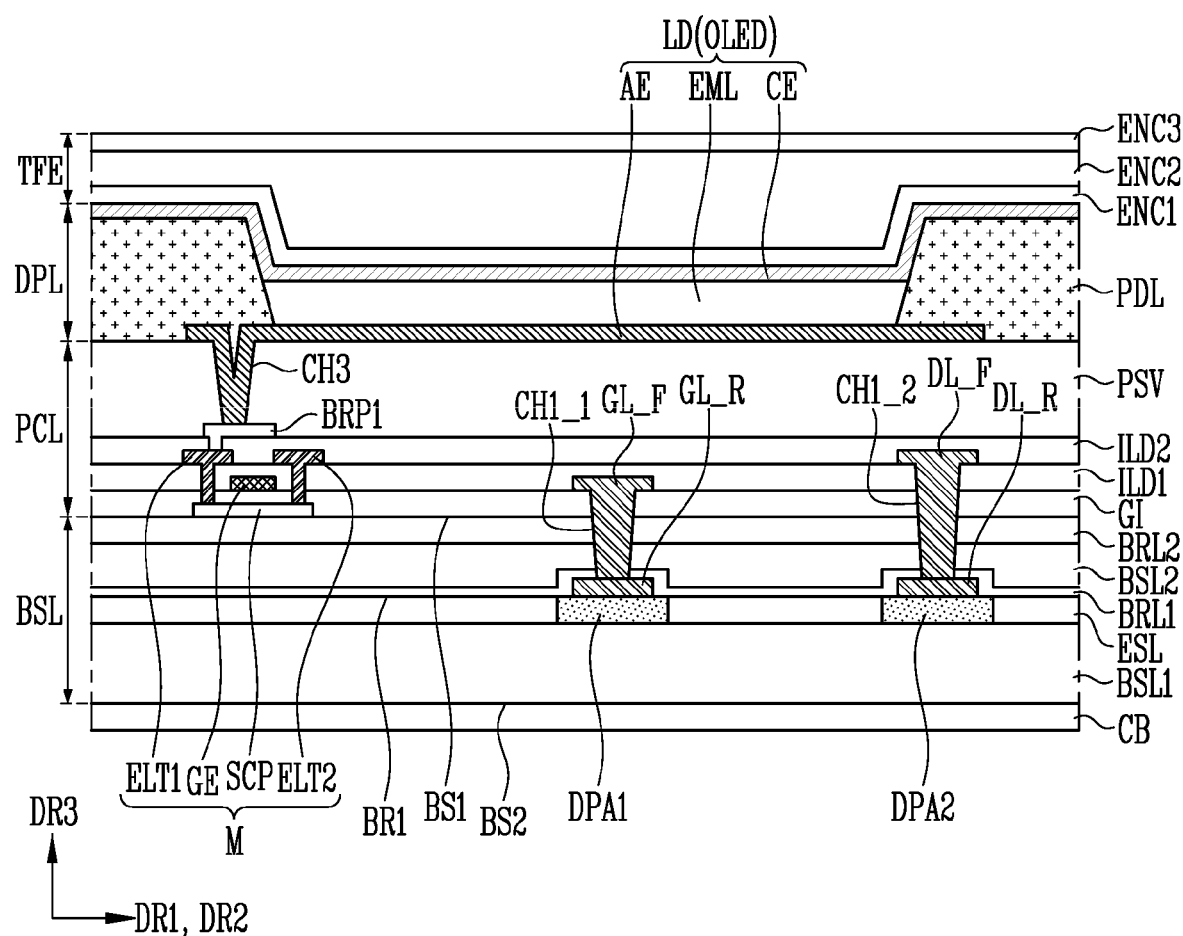
Figure 10G:
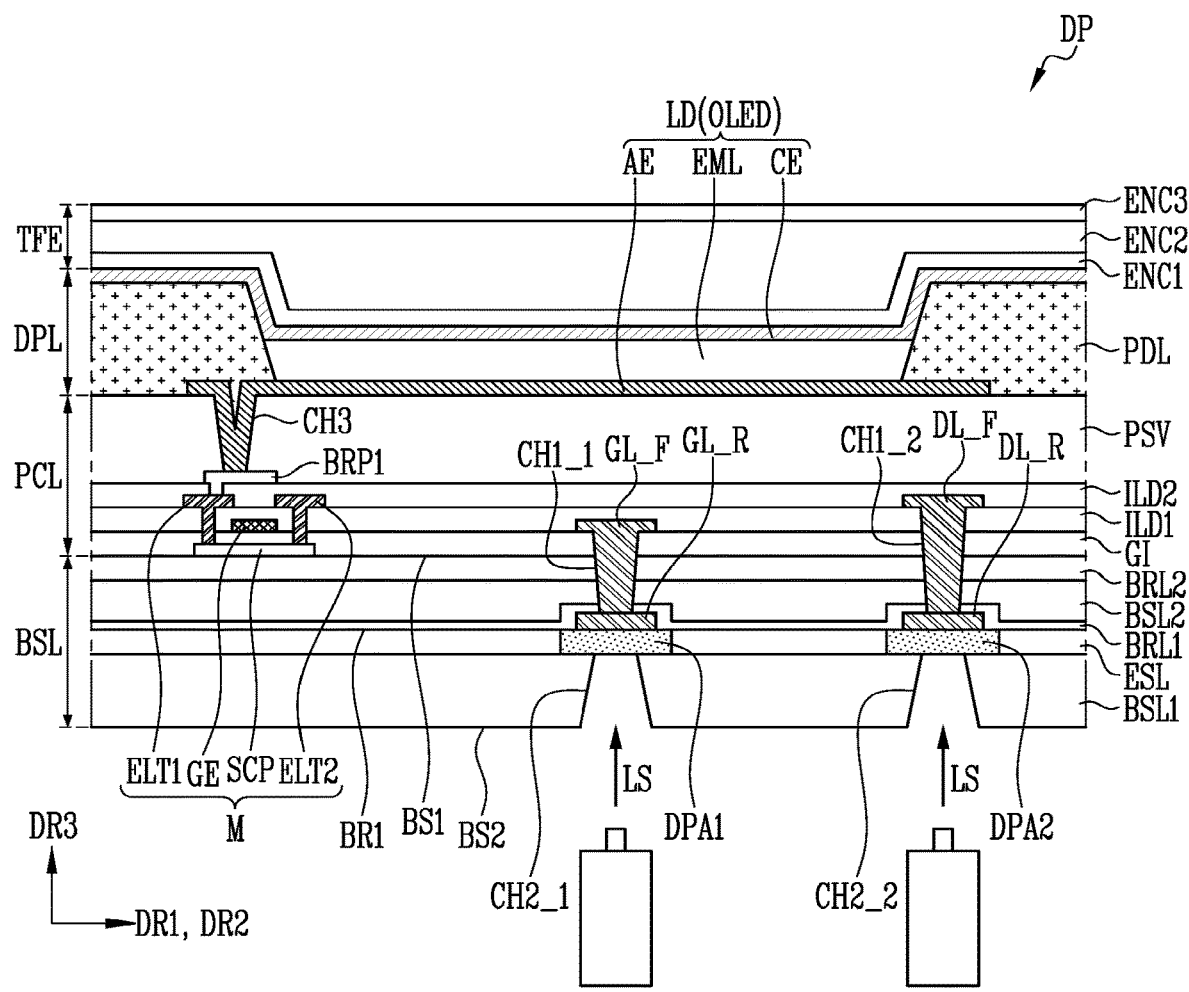

FIG. 8 is a cross-sectional view of the display panel taken along the line I-I' or the line II-II' of FIG. 6B. FIG. 9A is a plan view showing a contact hole formed in the area AA1 or the area AA2 of FIG. 6B. FIG. 9B is a plan view illustrating a contact hole formed in the area AA3 of FIG. 6B. FIG. 9C is a plan view illustrating a contact hole formed in the area AA4 of FIG. 6B.

In FIG. 8, a transistor M (e.g., the first transistor M1 in FIG. 7) connected to a first electrode AE through a third contact hole CH3 and/or a first bridge pattern BRP1 is illustrated as an example of some circuit elements that may be disposed at (e.g., in or on) the pixel circuit layer PCL, and one first gate line GL_F and one first data line DL_F that may be disposed in a corresponding pixel area and/or a peripheral area is illustrated as an example of the first lines LI1 (e.g., including the first gate lines GL_F and the first data lines DL_F) that may be disposed at (e.g., in or on) the pixel circuit layer PCL.

While the illustration of the first and second power lines PL1 and PL2 (e.g., see FIG. 7) for supplying the first and second power supply voltages VDD and VSS to the pixels PX is omitted in FIG. 8, the first and second power lines PL1 and PL2 (e.g., the first and second front power lines) may be disposed at (e.g., in or on) the pixel circuit layer PCL, like the first gate line GL_F and the first data line DL_F. For example, the first and second power lines PL1 and PL2 may be disposed at (e.g., in or on) the pixel circuit layer PCL, and may be connected to the light emitting element LD of each of the pixels PX through each corresponding pixel circuit PXC and/or at least one corresponding contact hole. In addition, the first and second power lines PL1 and PL2 may be connected to a power supply unit (e.g., a power supply) through a pad area (e.g., a predetermined pad area) formed on the second surface BS2 of the base layer BSL in the same or substantially the same manner as those of the first gate line GL_F and the first data line DL_F.

Referring to FIGS. 1 to 8, the display panel DP may include the pixel circuit layer PCL, the display element layer DPL, and the thin-film encapsulation layer TFE, which are sequentially disposed on the first surface BS1 of the base layer BSL. However, the mutual positions of the pixel circuit layer PCL, the display element layer DPL, and/or the thin-film encapsulation layer TFE may be various modified as needed or desired according to embodiments.

The base layer BSL may have a structure in which the first base layer BSL1, the etch stop layer ESL, the conductive layer MTL (e.g., see also FIG. 3B), the first barrier BRL1, the second base layer BSL2, and the second barrier layer BRL2 are sequentially stacked. In some embodiments, the display panel DP may optionally further include a protective layer (e.g., a protective film) disposed on the second surface BS2 of the base layer BSL, so as to cover a first pad PD1 and a second pad PD2. In this case, the first pad PD1 and the second pad PD2 may be exposed from the protective layer.

As described above, the first gate lines GL_F included in the pixel circuit layer PCL and the second gate lines GL_R included in the conductive layer MTL may be electrically connected to each other through the (1-1)-th contact holes CH1_1, and the first data lines DL_F included in the pixel circuit layer PCL and the second data lines GL_R included in the conductive layer MTL may be electrically connected to each other through the (1-2)-th contact holes CH1_2.

According to an embodiment of the present disclosure, the display panel DP may further include a first doping area DPA1 and a second doping area DPA2 formed at (e.g., in or on) the etch stop layer ESL, and the first pad PD1 and the second pad PD2 formed on the second surface BS2 of the base layer BSL. For example, the first doping area DPA1 may be formed at (e.g., in or on) an area of the etch stop layer ESL overlapping with the second gate lines GL_R in the third direction DR3 (e.g., the thickness direction), and the second doping area DPA2 may be formed at (e.g., in or on) an area of the etch stop layer ESL overlapping with the second data lines DL_R in the third direction DR3 (e.g., the thickness direction).

The etch stop layer ESL may include amorphous silicon (a-Si). Because amorphous silicon (a-Si) may absorb most of the laser wavelength during laser irradiation from the second surface BS2 of the base layer BSL in the direction towards the first surface BS1, damage to the second gate line GL_R and the second data line DL_R, which are metal patterns, may be prevented or reduced. For example, amorphous silicon (a-Si) may transmit about 30% of the laser wavelength.

On the other hand, when the etch stop layer ESL is omitted (or in other words, in an embodiment in which the second gate line GL_R and the second data line DL_R are formed between the first barrier layer BRL1 and the second base layer BSL2), the first barrier layer BRL1 may function as the etch stop layer ESL. The first barrier layer BRL1 may include silicon oxide ($SiO_2$) or silicon nitride ($SiN_x$). In this case, because silicon oxide ($SiO_2$) and/or silicon nitride ($SiN_x$) may not absorb most of the laser wavelength during laser irradiation from the second surface BS2 of the base layer BSL in the direction towards the first surface BS1, the second gate line GL_R and the second data line DL_R, which are metal patterns, may be damaged. For example, silicon oxide ($SiO_2$) and/or silicon nitride ($SiN_x$) may transmit about 90% of the laser wavelength.

When the etch stop layer ESL includes amorphous silicon (a-Si), the etch stop layer ESL may have a resistance of about 10 gigaohms (G$\Omega$). In other words, the etch stop layer ESL including amorphous silicon (a-Si) may have semiconductor properties (or in other words, the etch stop layer ESL may function as a non-conductor). However, when amorphous silicon (a-Si) is doped with boron and then annealed, the resistance thereof may be reduced to about 70 kiloohms (k$\Omega$). In other words, the first doping area DPA1 and the second doping area DPA2, in which the etch stop layer ESL including amorphous silicon (a-Si) is doped with boron, may have conductive properties (or in other words, the first doping area DPA1 and the second doping area DPA2 may function as a conductor).

The first base layer BSL1 may include a (2-1)-th contact hole CH2_1 in an area overlapping with the first doping area DPA1 in the third direction DR3 (e.g., the thickness direction), and a (2-2)-th contact hole CH2_2 in an area overlapping with the second doping area DPA2 in the third direction DR3 (e.g., the thickness direction). The first pad PD1 may be electrically connected to the first doping area DPA1 through the (2-1)-th contact hole CH2_1, and the second pad PD2 may be electrically connected to the second doping area DPA2 through the (2-2)-th contact hole CH2_2. The first doping area DPA1 may be electrically connected to the second gate line GL_R and the first gate line GL_F. As a result, the first pad PD1 may be electrically connected to the first gate line GL_F. In addition, the second doping area DPA2 may be electrically connected to the second data line DL_R and the first data line DL_F. As a result, the second pad PD2 may be electrically connected to the first data line DL_F.

FIGS. 8 and 9A illustrate a structure in which the (1-1)-th contact hole CH1_1, an area of the second gate line GL_R, the first doping area DPA1, and the (2-1)-th contact hole CH2_1 are overlapped with each other in the third direction DR3, and the (1-2)-th contact hole CH1_2, an area of the second data line DL_R, the second doping area DPA2, and the (2-2)-th contact hole CH2_2 are overlapped with each other in the third direction DR3. However, the present disclosure is not limited thereto, and the structure shown in FIGS. 8 and 9A may be limited to the area AA1 and/or the area AA2 of FIG. 6B.

In other words, referring to FIGS. 6B, 9B, and 9C, at (e.g., in or on) the area AA3, the (1-1)-th contact hole CH1_1, an area of the second gate line GL_R, and the etch stop layer ESL may be overlapped with each other in the third direction DR3 without the (2-1)-th contact hole CH2_1, and at (e.g., in or on) the area AA4, an area of the second gate line GL_R, the first doping area DPA1, and the (2-1)-th contact hole CH2_1 may be overlapped with each other in the third direction without the (1-1)-th contact hole CH1_1. In other words, the (1-1)-th contact hole CH1_1 and the (2-1)-th contact hole CH2_1 may not necessarily overlap with each other in the third direction DR3. Because the structures of the (1-2)-th contact hole CH1_2 and the (2-2)-th contact hole CH2_2 may be the same or substantially the same as (or similar to) those of the (1-1)-th contact hole CH1_1 and the (2-1)-th contact hole CH2_1, redundant description thereof may not be repeated.

On the other hand, because the embodiment illustrated in FIG. 6C includes the structure in which the first contact holes CH1_1 and CH1_2 and the second contact holes CH2_1 and CH2_2 overlap with each other in the thickness direction (e.g., the third direction DR3), the overlapping structure thereof illustrated in FIGS. 8 and 9A may be included in the embodiment of FIG. 6C.

As such, in a double polyimide layer structure in which the base layer BSL includes the first base layer BSL1, the first barrier layer BRL1, the second base layer BSL2, and the second barrier layer BRL2, which are sequentially stacked, because the base layer BSL further includes the etch stop layer ESL having the first doping area DPA1 and the second doping area DPA2 between the first base layer BSL1 and the first barrier layer BRL1, the (2-1)-th contact hole CH2_1 and the (2-2)-th contact hole CH2_2 may be efficiently formed.

When the base layer BSL is a glass base layer, it may take a long time to form the contact holes, and it may be difficult to form the contact hole in the third direction DR3 without an error due to difficulties of the process. For example, the glass base layer may have a thickness of about 500 (μm). On the other hand, the base layer BSL having the double polyimide layer structure may have a thickness of about 10 (μm). Therefore, in the base layer BSL having a smaller thickness compared to the glass base layer (e.g., a glass substrate), the time used to form the contact hole may be reduced, and the contact hole may be formed in the third direction DR3 without error.

In addition, when the etch stop layer ESL includes amorphous silicon (a-Si), the etch stop layer ESL may absorb most of the laser wavelength, thereby preventing or reducing damage to the second gate lines GL_R and the second data lines DL_R. Furthermore, by forming the first doping area DPA1 having conductivity at (e.g., in or on) an area of the etch stop layer ESL, the first pad PD1 and the second gate line GL_R may be electrically connected to each other through the (2-1)-th contact hole CH2_1 without removing the etch stop layer ESL, and the second pad PD2 and the second data line DL_R may be electrically connected to each other through the (2-2)-th contact hole CH2_2, thereby improving the yield of a manufacturing process.

The pixel circuit layer PCL may be disposed on the base layer BSL.

The pixel circuit layer PCL may include the circuit elements constituting the pixel circuit PXC of each of the pixels PX, and the first lines LI1 connected to the pixel circuits PXC and/or the light emitting elements LD of the pixels PX. For example, the pixel circuit layer PCL may include the circuit elements constituting the pixel circuit PXC of each of the pixels PX, and the first gate lines GL_F and the first data lines DL_F connected to the circuit elements. Additionally, the pixel circuit layer PCL may further include other suitable types of front signal lines and/or first and second front power lines connected to the pixels PX. In this case, the first lines LI1 may further include the other suitable types of the front signal/power lines, in addition to the first gate lines GL_F and the first data lines DL_F.

In addition, the pixel circuit layer PCL may include a plurality of insulating layers, in addition to the circuit elements and the first lines LI1. For example, the pixel circuit layer PCL may include a gate insulating layer GI, a first interlayer insulating layer ILD1, a second interlayer insulating layer ILD2, and/or a passivation layer PSV, which are sequentially disposed on the first surface BS1 of the base layer BSL.

According to an embodiment, a semiconductor layer may be disposed on the first surface BS1 of the base layer BSL. The semiconductor layer may include a semiconductor pattern SCP of each transistor M. The semiconductor pattern SCP may include a channel region overlapping with a gate electrode GE of the transistor M, and first and second conductive regions (e.g., source and drain regions) disposed at (e.g., in or on) opposite sides of the channel region.

The gate insulating layer GI may be disposed on the semiconductor layer. A first conductive layer may be disposed on the gate insulating layer GI. For example, the first conductive layer may include the gate electrode GE of each transistor M. In addition, the first conductive layer may further include at least one first line LI1 (e.g., the first gate lines GL_F).

The first interlayer insulating layer ILD1 may be disposed on the first conductive layer. A second conductive layer may be disposed on the first interlayer insulating layer ILD1.

The second conductive layer may include first and second transistor electrodes ELT1 and ELT2 of each transistor M. The first and second transistor electrodes ELT1 and ELT2 may be the source and drain electrodes of the transistor M. In addition, the second conductive layer may further include at least one first line LI1 (e.g., the first data lines DL_F).

The second interlayer insulating layer ILD2 may be disposed on the second conductive layer. A third conductive layer may be disposed on the second interlayer insulating layer ILD2.

The third conductive layer may include the first bridge pattern BRP1 and/or at least one first line LI1 (e.g., the first and second front power lines and/or the front sensing lines) for connecting the pixel circuit layer PCL to the display element layer DPL. The first bridge pattern BRP1 may be connected to the first electrode AE of the light emitting element LD of the pixel PX through the third contact hole CH3 and/or the like.

The passivation layer PSV may be disposed on the third conductive layer. The display element layer DPL may be disposed on the pixel circuit layer PCL including the passivation layer PSV.

The display element layer DPL may include the light emitting elements LD of the pixels PX and/or the electrodes connected thereto. For example, an organic light emitting diode or a plurality of nano-scale inorganic light emitting diodes may be disposed in each pixel area of the display element layer DPL.

In an embodiment, when the light emitting element LD of the pixel PX is the organic light emitting diode OLED as shown in the embodiment of FIG. 7, the display element layer DPL may include the organic light emitting diode OLED formed in each pixel area as illustrated in FIG. 8.

In the embodiment of FIG. 8, the display element layer DPL may include the light emitting element LD formed in each pixel area, and the light emitting element LD may be the organic light emitting diode OLED. In this case, the light emitting element LD may include the first and second electrodes AE and CE, and an emission layer EML disposed between the first and second electrodes AE and CE.

One of the first and second electrodes AE and CE may be the anode electrode, and the other thereof may be the cathode electrode. When the light emitting element LD is a top emission type organic light emitting diode (OLED), the first electrode AE may be a reflective electrode, and the second electrode CE may be a transmissive electrode. In an embodiment of the present disclosure, for convenience, a case in which the light emitting element LD is the top emission type organic light emitting diode (OLED), the first electrode AE is the anode electrode, and the second electrode CE is the cathode electrode will be described in more detail as an example.

The first electrode AE may be connected to a circuit element (e.g., the first transistor M1 of FIG. 7) of the pixel circuit layer PCL through the first bridge pattern BRP1 and/or the third contact hole CH3 penetrating through the passivation layer PSV. The first electrode AE may include a reflective layer capable of reflecting light, and/or a transparent conductive layer disposed above or below the reflective layer. For example, the first electrode AE may include multilayered conductive films including a lower transparent conductive film and an upper transparent conductive film including indium tin oxide (ITO), and a reflective film including silver (Ag) and provided between the lower transparent conductive film and the upper transparent conductive film.

The display element layer DPL may further include a pixel defining layer PDL having an opening exposing a portion of the first electrode AE, for example, such as a portion of an upper surface of the first electrode AE. The pixel defining layer PDL may be an organic insulating film including an organic material. For example, the pixel defining layer PDL may include an organic insulating layer including an organic material, for example, such as an acrylic resin, an epoxy resin, a phenolic resin, a polyamide resin, and/or a polyimide resin.

The emission layer EML may be disposed at (e.g., in or on) an area corresponding to the opening of the pixel defining layer PDL. In other words, the emission layer EML may be disposed on a surface (e.g., the upper surface) of the exposed first electrode AE. The emission layer EML may have a multilayered thin-film structure including at least a light generation layer. The emission layer EML may include a hole injection layer that injects holes, a hole transport layer that has an excellent hole transportability and increases the chance of recombination between holes and electrons by suppressing the movement of electrons that could not be bonded in the light generation layer, the light generation layer that emits light by recombination of injected electrons and holes, a hole blocking layer that suppresses the movement of holes that could not be recombined in the light generation layer, an electron transport layer that smoothly transports electrons to the light generation layer, and/or an electron injection layer that injects the electrons.

The light generation layer may be formed individually at (e.g., in or on) the emission area of each pixel PX, and the hole injection layer, the hole transport layer, the hole blocking layer, the electron transport layer, and the electron injection layer may be a common layer connected to the emission areas that are adjacent to each other. However, in FIG. 8, the emission layer EML is illustrated based on the light generation layer.

The second electrode CE may be provided and/or formed on the emission layer EML. The second electrode CE may be a common layer that is commonly provided to the pixels PX, but the present disclosure is not limited thereto. The second electrode CE may be a transmissive electrode, and may include a transparent conductive material. The transparent conductive material may include at least one from among a transparent conductive oxide, for example, such as indium tin oxide (ITO), indium zinc oxide (IZO), zinc oxide (ZnO), or indium tin zinc oxide (ITZO), and/or a conductive polymer, for example, such as PEDOT, but the present disclosure is not limited thereto.

The thin-film encapsulation layer TFE may be provided and/or formed on the display element layer DPL including the light emitting elements LD of the pixels PXL.

The thin-film encapsulation layer TFE may include a single layer or multiple layers. In an embodiment, the thin-film encapsulation layer TFE may include a plurality of insulating layers covering the display element layer DPL. For example, the thin-film encapsulation layer TFE may include at least one inorganic film and at least one organic film.

For example, the thin-film encapsulation layer TFE may have a structure in which an inorganic film and an organic film are alternately stacked. In an embodiment, the thin-film encapsulation layer TFE may include first to third encapsulation layers ENC1 to ENC3. The first encapsulation layer ENC1 may be disposed on the display element layer DPL, and may be positioned over at least a portion of the display area DA and the non-display area NA. The second encapsulation layer ENC2 may be disposed on the first encapsulation layer ENC1, and may be positioned over at least a portion of the display area DA and the non-display area NA. The third encapsulation layer ENC3 may be disposed on the second encapsulation layer ENC2, and may be positioned over at least a portion of the display area DA and the non-display area NA. In an embodiment, the first and third encapsulation layers ENC1 and ENC3 may include an inorganic film including an inorganic material, and the second encapsulation layer ENC2 may include an organic film including an organic material.

FIGS. 10A to 10G are cross-sectional views illustrating various processes of a method for manufacturing a display device according to an embodiment of the present disclosure.

Referring to FIGS. 1 to 10A, the method for manufacturing the display device DD according to an embodiment of the present disclosure may include preparing a carrier substrate CB. For example, the carrier substrate CB may be a rigid glass substrate. Because the rigid glass substrate may support the display device DD to be formed on the upper surface thereof, a rigid material may be used. As the material of the rigid glass substrate, glass including (e.g., containing) silicon dioxide ($SiO_2$) as a main component may be used. In addition, at least one or more from among borosilicate glass, fused silica glass, and/or quartz glass may be used.

A first base layer BSL1 may be formed on the carrier substrate CB. In this case, the first base layer BSL1 may include a polyimide (PI) varnish or a polyimide film. In more detail, when the first base layer BSL1 includes the polyimide varnish, the first base layer BSL1 may be applied onto the carrier substrate CB through slit die coating.

An etch stop layer ESL may be formed on the first base layer BSL1. The etch stop layer ESL may include amorphous silicon. Amorphous silicon is crystallized into polycrystalline silicon in various ways. As the crystallization method, various suitable methods, for example, such as rapid thermal annealing (RTA), solid phase crystallization (SPC), excimer laser annealing (ELA), metal induced crystallization (MIC), metal induced lateral crystallization (MILC), and/or sequential lateral solidification (SLS), may be applied. In this case, amorphous silicon (a-Si) may absorb most of the laser wavelength when the laser is irradiated from the lower surface of the first base layer BSL1. For example, Amorphous silicon (a-Si) may transmit only about 30% of the laser wavelength. Therefore, damage to the second gate line GL_R and the second data line DL_R, which are metal patterns, may be prevented or reduced.

Referring to FIGS. 1 to 10B, the method for manufacturing the display device DD according to an embodiment of the present disclosure may include a photo process of forming first and second doping areas DPA1 and DPA2. A photosensitive organic film PR is formed on the etch stop layer ESL. The organic film PR may include, for example, at least one organic material selected from among benzocyclobutene (BCB), polyimide (PI), polyamaide (PA), acrylic resin, phenol resin, and/or the like.

Afterwards, an exposure process may be performed. For example, the exposure process will be described in more detail hereinafter assuming that the forming of the photosensitive organic film PR includes using a photosensitive layer including a positive photosensitive material, but the present disclosure is not limited thereto. In another embodiment, the photosensitive organic film PR may be formed using a photosensitive layer including a negative photosensitive material. A mask may be disposed on the photosensitive organic film PR. In this case, the mask may have different light transmittances of areas A2 and A4 from which the photosensitive organic film PR is to be removed from those of areas A1, A3, and A5 where the photosensitive organic film PR will remain. For example, the mask may transmit more light at the areas A2 and A4 than at the areas A1, A3, and A5. In other words, in the mask, the areas A2 and A4 from which the photosensitive organic film PR is to be removed may transmit light or mostly transmit light, and the areas A1, A3 and A5 where the photosensitive organic film PR is to remain may not transmit light or may hardly transmit light. Then, the photosensitive organic film PR is removed from the exposed portions through development to expose the lower etch stop layer ESL. On the other hand, in the area where light is blocked, the photosensitive organic film PR remains, so that the etch stop layer ESL thereunder may not be exposed.

Referring to FIGS. 1 to 10C, the method for manufacturing the display device DD according to an embodiment of the present disclosure may include a doping process of forming first and second doping areas DPA1 and DPA2.

In the etch stop layer ESL, the areas A2 and A4 from which the photosensitive organic film PR is removed may be exposed. The areas A2 and A4 from which the photosensitive organic film PR has been removed may overlap with the first doping area DPA1 and the second doping area DPA2 in the third direction DR3. The etch stop layer ESL of the areas A2 and A4 from which the photosensitive organic film PR has been removed may be doped with impurities. In this case, the impurities may be boron.

Referring to FIGS. 1 to 10D, the method for manufacturing the display device DD according to an embodiment of the present disclosure may include a stripping process of the photosensitive organic film PR, and an annealing process.

After the doping process is finished, the photosensitive organic film PR is removed, and then the etch stop layer ESL in which the entire area thereof is exposed may be annealed. For example, the annealing process of about 300° C. to 500° C. may be performed. Through the annealing process, the etch stop layer ESL and/or the first base layer BSL1 may be cured.

In this case, when the etch stop layer ESL includes amorphous silicon (a-Si), the etch stop layer ESL may have a resistance of about 10 (GΩ). In other words, the etch stop layer ESL including amorphous silicon (a-Si) may function as a non-conductor. However, when amorphous silicon (a-Si) is doped with boron and then heat-treated, the resistance thereof may be reduced to about 70 (kΩ). In other words, the first doping area DPA1 and the second doping area DPA2, in which the etch stop layer ESL including amorphous silicon (a-Si) is doped with boron, may function as a conductor.

Referring to FIGS. 1 to 10E, the method for manufacturing the display device DD according to an embodiment of the present disclosure may include forming second gate lines GL_R and second data lines DL_R, and sequentially forming a first barrier layer BRL1, a second base layer BSL2, and a second barrier layer BRL2 thereon.

Referring to FIGS. 6A and 6B, the second gate lines GL_R and the second data lines DL_R may substantially overlap with the first gate lines GL_F and the first data lines DL_F in the third direction DR3, so as to be connected to each other through the (1-1)-th contact holes CH1_1 and the (1-2)-th contact holes CH1_2. In this case, the second gate lines GL_R and the second data lines DL_R may be formed by patterning the conductive layer MTL illustrated in FIG. 3B.

In addition, the first doping area DPA1 and the second doping area DPA2 may be disposed in the areas where the second gate lines GL_R and the second data lines DL_R overlap with the (2-1)-th contact hole CH2_1 and the (2-2)-th contact hole CH2_2 in the third direction DR3. Therefore, the second gate lines GL_R, the first doping area DPA1, and the first pad PD1 are electrically connected to each other, and the second data lines DL_R, the second doping area DPA2, and the second pad PD2 may be electrically connected to each other.

After that, the first barrier layer BRL1, the second base layer BSL2, and the second barrier layer BRL2 may be sequentially formed.

The first barrier layer BRL1 may be formed on one surface of the etch stop layer ESL. In an embodiment, the first barrier layer BRL1 may be formed through a deposition process, for example, such as chemical vapor deposition (CVD), but the method of forming the first barrier layer BRL1 is not limited thereto. The first barrier layer BRL1 may be formed as a single layer or multiple layers using at least one inorganic insulating material selected from among silicon nitride ($SiN_x$), silicon oxide ($SiO_x$), and/or silicon nitride ($SiO_xN_y$), but the material for forming the first barrier layer BRL1 is not limited thereto.

The second base layer BSL2 may be formed on one surface of the first barrier layer BRL1. In this case, the second base layer BSL2 may include a polyimide (PI) varnish or a polyimide film.

The second barrier layer BRL2 may be formed on one surface of the second base layer BSL2. In an embodiment, the second barrier layer BRL2 may be formed through a deposition process, for example, such as chemical vapor deposition (CVD), but the method of forming the second barrier layer BRL2 is not limited thereto. The second barrier layer BRL2 may be formed as a single layer or multiple layers using at least one inorganic insulating material selected from among silicon nitride ($SiN_x$), silicon oxide ($SiO_x$), and/or silicon nitride ($SiO_xN_y$), but the material for forming the second barrier layer BRL2 is not limited thereto.

Referring to FIGS. 1 to 10F, the method for manufacturing the display device DD according to an embodiment of the present disclosure includes forming a pixel circuit layer PCL, a display element layer DPL, and a thin-film encapsulation layer TFE. Because the pixel circuit layer PCL, the display element layer DPL, and the thin-film encapsulation layer TFE have been described above with reference to FIG. 8, redundant description thereof may not be repeated.

According to an embodiment of the present disclosure, the first gate lines GL_F formed on the gate insulating layer GI may be connected to the second gate lines GL_R formed on the etch stop layer ESL through the (1-1)-th contact holes CH1_1, and the first data lines DL_F formed on the first interlayer insulating layer ILD1 may be connected to the second data lines DL_R formed on the etch stop layer ESL through the (1-2)-th contact holes CH1_2. In this case, the (1-1)-th contact holes CH1_1 and the (1-2)-th contact holes CH1_2 may be formed through dry etching in a chamber. Therefore, it may be possible to prevent or substantially prevent the second gate lines GL_R and the second data lines DL_R from being damaged during the process of forming the (1-1)-th contact holes CH1_1 and the (1-2)-th contact holes CH1_2.

Referring to FIGS. 1 to 10G, the method for manufacturing the display device DD according to an embodiment of the present disclosure may include removing the carrier substrate CB, and forming the (2-1)-th contact holes CH2_1 and the (2-2)_th contact holes CH2_2.

When the carrier substrate CB is removed, one surface, for example, the lower surface of the first base layer BSL1, may be exposed to the outside. A laser LS may be irradiated on an area of the first base layer BSL1 overlapping with the second gate line GL_R and the first doping area DPA1 in the third direction DR3 (or in other words, the area of the (2-1)-th contact hole CH2_1). When the laser LS is irradiated, at least a portion of the first base layer BSL1 may be removed from the area of the (2-1)-th contact hole CH2_1, or physical properties thereof may be changed therein. Similarly, the laser LS may be irradiated on an area of the first base layer BSL1 overlapping with the second data line DL_R and the second doping area DPA2 in the third direction DR3 (or in other words, the area of the (2-2)-th contact hole CH2_2). When the laser LS is irradiated, at least a portion of the first base layer BSL1 may be removed from the area of the (2-2)-th contact hole CH2_2, or physical properties thereof may be changed therein.

In this case, when the etch stop layer ESL includes amorphous silicon (a-Si), the etch stop layer ESL absorbs most of the laser wavelength, thereby preventing or reducing damage to the second gate lines GL_R and the second data lines DL_R. Furthermore, by forming the first doping area DPA1 having electrical conductivity in an area of the etch stop layer ESL, the first pad PD1 and the second gate line GL_R may be electrically connected to each other through the (2-1)-th contact hole CH2_1 without removing the etch stop layer ESL, and the second pad PD2 and the second data line DL_R may be electrically connected to each other through the (2-2)-th contact hole CH2_2, thereby improving the yield of the manufacturing process.

Referring to FIG. 8, the method for manufacturing the display device DD according to an embodiment of the present disclosure may include forming a first pad PD1 and a second pad PD2.

According to an embodiment, the first pad PD1 may be formed on the first base layer BSL1 in which the (2-1)-th contact hole CH2_1 is formed, and the second pad PD2 may be formed on the first base layer BSL1 in which the (2-2)-th contact hole CH2_2 is formed.

For example, the first pad PD1 formed in the first pad area PA1 may be connected to a gate driver, and the second pad PD2 formed in the second pad area PA2 may be connected to a data driver. The second gate lines GL_R may be connected to a first connection film (e.g., a COF-type first connection film) on which the gate driver is mounted (or connected) through the first pad PD1, and the second data lines DL_R may be connected to a second connection film (e.g., a COF-type second connection film) on which the data driver is mounted through the second pad PD2.

As such, in a double polyimide in which the base layer BSL includes the first base layer BSL1, the first barrier layer BRL1, the second base layer BSL2, and the second barrier layer BRL2, which are sequentially stacked, because the base layer BSL further includes the etch stop layer ESL having a first doping area DPA1 and a second doping area DPA2 between the first base layer BSL1 and the first barrier layer BRL1, the (2-1)-th contact hole CH2_1 and the (2-2)-th contact hole CH2_2 may be efficiently formed.

When the base layer BSL is a glass base layer, it may take a long time to form the contact holes, and it may be difficult to form the contact holes in the third direction DR3 without error due to the difficulty of the process. For example, the glass base layer may have a thickness of about 500 ($\mu m$). On the other hand, the base layer BSL having the double polyimide layer structure may have a thickness of about 10 ($\mu m$). Therefore, in the base layer BSL having a smaller thickness compared to the glass substrate, the time used to form the contact holes may be reduced, and the contact holes may be formed in the third direction DR3 without error.

When the multi-screen display device TDD is configured using the display devices DD in which the non-display area NA is minimized or reduced as those described above, the seam area that may be formed between the display devices DD may be reduced or removed, and an image that naturally continues even in the boundary area between the display devices DD may be displayed. Therefore, it may be possible to easily manufacture multi-screen display devices TDD having various suitable sizes by using the display devices DD.

In the display device according to one or more embodiments of the present disclosure, the display panel uses the base layer including the double polyimide layer, and the amorphous silicon layer and the conductive layer may be formed between two polyimide layers, thereby forming the contact holes more efficiently.

However, the aspects and features of the present disclosure are not limited to the above-described aspects and features, and other aspects and features may be realized from the present disclosure, or may be learned by practicing one or more of the presented embodiments of the present disclosure, without departing from the spirit and scope of the present disclosure.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A method for manufacturing a display device, the method comprising:
    forming a first base layer on a carrier substrate;
    forming an etch stop layer on the first base layer;
    forming a plurality of second lines on the etch stop layer;
    forming a second base layer on the etch stop layer and the second lines;
    forming a plurality of pixels and a plurality of first lines on the second base layer;
    forming a plurality of first contact holes for electrically connecting the first lines to the second lines; and
    exposing a surface of the first base layer opposite to that on which the etch stop layer is formed.

2. The method of claim 1, wherein the first contact holes are formed using dry etching.

3. A method for manufacturing a display device, the method comprising:
    forming a first base layer on a carrier substrate;
    forming an etch stop layer on the first base layer;
    forming a plurality of second lines on the etch stop layer;
    forming a second base layer on the etch stop layer and the second lines;
    forming a plurality of pixels and a plurality of first lines on the second base layer;
    forming a plurality of first contact holes for electrically connecting the first lines to the second lines; and
    forming a plurality of pads on a surface of the first base layer,
    wherein the forming of the etch stop layer comprises forming doping areas in areas of the etch stop layer overlapping with the second lines and/or the pads in a thickness direction.

4. The method of claim 3, further comprising forming second contact holes in areas of the first base layer overlapping with the second lines and/or the doping areas in the thickness direction.

5. The method of claim 4, wherein the second contact holes are formed using a laser process.

6. The method of claim 3, wherein the etch stop layer comprises amorphous silicon, and the doping areas are doped with boron.

* * * * *